US012562725B2

(12) United States Patent
You

(10) Patent No.: US 12,562,725 B2
(45) Date of Patent: Feb. 24, 2026

(54) SEMICONDUCTOR SYSTEM FOR MONITORING RESULTS OF DETERMINATION OF DUTY RATIO OF DATA CLOCK SIGNALS

(71) Applicant: SK hynix Inc., Icheon-si Gyeonggi-do (KR)

(72) Inventor: Jung Taek You, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 9 days.

(21) Appl. No.: 18/638,927

(22) Filed: Apr. 18, 2024

(65) Prior Publication Data

US 2025/0167778 A1     May 22, 2025

(30) Foreign Application Priority Data

Nov. 21, 2023     (KR) ......................... 10-2023-0162725

(51) Int. Cl.
*H03K 5/156*          (2006.01)
*G11C 7/22*           (2006.01)
(52) U.S. Cl.
CPC ........... *H03K 5/1565* (2013.01); *G11C 7/222* (2013.01); *G11C 2207/2254* (2013.01)

(58) Field of Classification Search
CPC ...................................................... H03K 5/1565
USPC .......................................................... 327/175
See application file for complete search history.

(56) References Cited

U.S. PATENT DOCUMENTS

2007/0086267 A1*    4/2007   Kwak ...................... G11C 7/22
                                                              365/233.1

FOREIGN PATENT DOCUMENTS

KR          1020180124395 A      11/2018

* cited by examiner

*Primary Examiner* — Tomi Skibinski
(74) *Attorney, Agent, or Firm* — WILLIAM PARK AND ASSOCIATES LTD.

(57)                    ABSTRACT
A semiconductor device includes a duty ratio determination circuit configured to generate a duty information signal in response to receiving a first data clock signal and a second data clock signal in phase or in reverse phase according to a phase selection signal and determining a duty ratio of the first data clock signal and the second data clock signal during a time period when a duty monitoring enable signal for performing a duty monitoring operation is enabled and a selection transfer circuit configured to generate data from the duty information signal and configured to output the data to a controller when a mode register command is enabled.

27 Claims, 13 Drawing Sheets

SEMICONDUCTOR SYSTEM FOR MONITORING RESULTS OF DETERMINATION OF DUTY RATIO OF DATA CLOCK SIGNALS

CROSS-REFERENCE TO RELATED APPLICATION

The present application claims priority under 35 U.S.C. § 119(a) to Korean Patent Application No. 10-2023-0162725, filed in the Korean Intellectual Property Office on Nov. 21, 2023, the entire contents of which application is incorporated herein by reference.

BACKGROUND

The present disclosure relates to a semiconductor system for monitoring the results of the determination or detection of the duty ratio of data clock signals.

As the operating speed of a semiconductor system increases, high-speed data transfer rate tends to be desirable between semiconductor devices included in the semiconductor system. Prefetch operations are applied to data that are input and output in series between the semiconductor devices in order to satisfy a high-speed data transfer rate or data high bandwidth. Prefetch refers to parallelizing data that are input in series by latching the data. In order to parallelize data, an internal clock signal dividing scheme is used. When an internal clock signal is divided, multi-phase clock signals having different phases are generated. The multi-phase clock signals are used to control the parallelization or serialization of data.

SUMMARY

In an embodiment, a semiconductor device may include a duty ratio determination circuit configured to generate a duty information signal in response to receiving a first data clock signal and a second data clock signal in phase or in reverse phase according to a phase selection signal and determining a duty ratio of the first data clock signal and the second data clock signal during a time period when a duty monitoring enable signal for performing a duty monitoring operation is enabled and a selection transfer circuit configured to generate data from the duty information signal and configured to output the data to a controller when a mode register command is enabled.

In an embodiment, a semiconductor device may include a duty ratio determination circuit configured to generate a duty information signal in response to receiving a first data clock signal and a second data clock signal in phase or in reverse phase according to a phase selection signal and determining a duty ratio of the first data clock signal and the second data clock signal during a time period when a duty monitoring enable signal for performing a duty monitoring operation is enabled and a data transfer circuit configured to latch the duty information signal when a mode register command is enabled, configured to generate first data or second data from the latched duty information signal based on a phase selection signal, and configured to output the first data or the second data to a controller.

In an embodiment, a duty monitoring method may include a first duty ratio operation including entering a duty monitoring operation and outputting data generated from a duty information signal that is generated in response to receiving a first data clock signal and a second data clock signal in phase or in reverse phase according to a phase selection signal and determining a duty ratio of the first data clock signal and the second data clock signal when a mode register command is enabled and a second duty ratio operation including outputting the data generated from the duty information signal that is generated in response to receiving the first data clock signal and the second data clock signal in phase or in reverse phase according to the phase selection signal and determining the duty ratio of the first data clock signal and the second data clock signal when the mode register command is enabled.

In an embodiment, a method may include, during a first time period, receiving a first data clock signal and a second data clock signal either in phase or in reverse phase and determining a duty ratio of the first data clock signal and the second data clock signal; generating a duty information signal in response to determining the duty ratio of the first data clock signal and the second data clock signal; and outputting data generated from the duty information signal.

BRIEF DESCRIPTION OF THE DRAWINGS

FIG. 7 is a diagram illustrating an embodiment of a selection transfer circuit.

FIG. 8 is a timing diagram illustrating timing of a duty monitoring operation of the semiconductor system according to an embodiment of the present disclosure.

FIG. 11 is a diagram illustrating an embodiment of a first selection transfer circuit.

FIG. 12 is a diagram illustrating an embodiment of a second selection transfer circuit.

DETAILED DESCRIPTION

Figure 1:
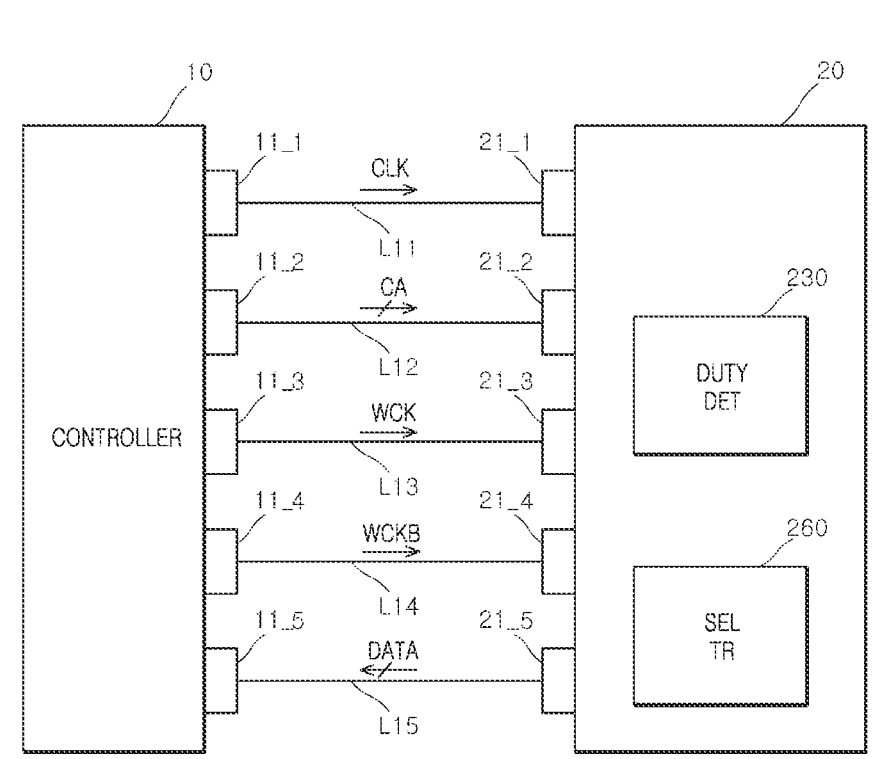
FIG. 1 is a block diagram illustrating a semiconductor system according to an embodiment of the present disclosure.

In the descriptions of the following embodiments, the term "preset" indicates that the numerical value of a parameter is previously decided or predetermined when the parameter is used in a process or algorithm. According to an embodiment, the numerical value of the parameter may be determined when the process or algorithm is started or while the process or algorithm is performed.

Terms such as "first" and "second," which are used to distinguish between various components, are not limited by these terms. For example, a first component may be referred to as a second component and vice versa.

When one component is referred to as "coupled" or "connected" to another component, the components may be directly coupled or connected to each other or coupled or connected to each other through another component interposed between the components.

When one component is referred to as "directly coupled" or "directly connected" to another component, the components are directly coupled or connected to each other without another component interposed between the components.

A "logic high level" and a "logic low level" are used to describe the logic levels of signals. A signal at a "logic high level" is distinguished from a signal at a "logic low level." For example, when a signal at a first voltage corresponds to a signal at a "logic high level," a signal at a second voltage corresponds to a signal at a "logic low level." According to an embodiment, a "logic high level" may be a voltage higher than a "logic low level." Logic levels of signals may be at different logic levels or opposite logic levels. For example, a signal at a logic high level may be at a logic low level in some embodiments, and a signal at a logic low level may be at a logic high level in some embodiments. A "logic level combination" includes a plurality or group of logic levels organized together, for example, a logic level combination of three may include a three-bit logic combination, such as 010, and a logic level combination of five may include a five-bit logic combination, such as 10101.

The present disclosure is described in more detail through embodiments. The embodiments are only used to provide examples within the present disclosure, and the scope of the present disclosure is not limited by the embodiments.

An embodiment of the present disclosure may provide a semiconductor system for monitoring the results of the determination or detection of the duty ratio of data clock signals.

According to an embodiment of the present disclosure, a duty ratio of a first data clock signal and a second data clock signal may be detected or determined in response to receiving the first data clock signal and the second data clock signal in phase or in reverse phase, also referred to as inverted or opposite phase, after the start of a duty monitoring operation.

According to an embodiment of the present disclosure, data may be generated from a duty information signal that is generated by detecting or determining the duty ratio of the first data clock signal and the second data clock signal after the start of a duty monitoring operation, and the results of the detection or determination of the duty ratio of the first data clock signal and the second data clock signal may be monitored by updating a controller with the data.

According to an embodiment of the present disclosure, the duty ratio of the first data clock signal and the second data clock signal may be adjusted by updating the controller with the results of the detection or determination of the duty ratio of the first data clock signal and the second data clock signal when a mode register command is generated after the start of a duty monitoring operation.

As illustrated in FIG. 1, an electronic system 1 according to an embodiment of the present disclosure includes a controller 10 and a semiconductor device 20.

The controller 10 includes a first control pin 11_1, a second control pin 11_2, a third control pin 11_3, a fourth control pin 11_4, and a fifth control pin 11_5. The semiconductor device 20 includes a first device pin 21_1, a second device pin 21_2, a third device pin 21_3, a fourth device pin 21_4, and a fifth device pin 21_5. A first transmission line L11 is connected between the first control pin 11_1 and the first device pin 21_1. A second transmission line L12 is connected between the second control pin 11_2 and the second device pin 21_2. A third transmission line L13 is connected between the third control pin 11_3 and the third device pin 21_3. A fourth transmission line L14 is connected between the fourth control pin 11_4 and the fourth device pin 21_4. A fifth transmission line L15 is connected between the fifth control pin 11_5 and the fifth device pin 21_5.

In the example of FIG. 1, the controller 10 transmits a clock signal CLK to the semiconductor device 20 through the first transmission line L11. The controller 10 transmits a command address CA for controlling the semiconductor device 20 to the semiconductor device 20 through the second transmission line L12. The controller 10 transmits a first data clock signal WCK to the semiconductor device 20 through the third transmission line L13. The controller 10 transmits a second data clock signal WCKB to the semiconductor device 20 through the fourth transmission line L14. The controller 10 receives data DATA from the semiconductor device 20 through the fifth transmission line L15. The command address CA includes a plurality of bits and is a signal including information for controlling a read operation of the semiconductor device 20 and information for controlling a duty monitoring operation of the semiconductor device 20. The clock signal CLK is a signal that is periodically toggled, for example, varied between a logic high level and a logic low level, in order to synchronize operations performed by the controller 10 and the semiconductor device 20. Each of the first data clock signal WCK and the second data clock signal WCKB is a signal that is periodically toggled in order to latch the data DATA. The first data clock signal WCK and the second data clock signal WCKB are signals that are toggled with different phases. The data DATA includes a plurality of bits and may be common data.

The semiconductor device 20 includes a duty ratio detection or determination circuit (DUTY DET) 230 and a selection transfer circuit (SEL TR) 260. The duty ratio determination circuit is also referred to as a duty ratio detection circuit in the present disclosure for the sake of simplicity.

During a time period when a duty monitoring enable signal (DCM_EN in FIG. 2) is enabled after the start of a duty monitoring operation based on the command address CA, the duty ratio detection circuit 230 generates a duty information signal (DTD in FIG. 2) in response to receiving the first data clock signal WCK and the second data clock signal WCKB in phase or in reverse phase according to a phase selection signal (DCM_SEL in FIG. 2) and detecting or determining the duty ratio of the first data clock signal WCK and the second data clock signal WCKB. The duty ratio detection circuit 230 generates the duty information signal (DTD in FIG. 2) in response to or upon receiving the first data clock signal WCK and the second data clock signal WCKB in phase when the phase selection signal (DCM_SEL in FIG. 2) is enabled and detects or determines the duty ratio of the first data clock signal WCK and the second data clock signal WCKB. The duty ratio detection circuit 230 generates the duty information signal (DTD in FIG. 2) in response to receiving the first data clock signal WCK and the second data clock signal WCKB in reverse phase when the phase selection signal (DCM_SEL in FIG. 2) is disabled and detects or determines the duty ratio of the first data clock signal WCK and the second data clock signal WCKB.

The selection transfer circuit 260 generates the data DATA from the duty information signal (DTD in FIG. 2) when a mode register command (MRW in FIG. 2) is enabled and outputs the data DATA to the controller 10 based on the command address CA. The selection transfer circuit 260 outputs, to the controller 10, the data DATA that are generated by latching and aligning first internal data, second internal data, third internal data, and fourth internal data (ID1, ID2, ID3, and ID4 in FIG. 2) in synchronization with the first data clock signal WCK and the second data clock signal WCKB when a read command (RD in FIG. 2) is enabled based on the command address CA.

The controller 10 detects or determines the duty ratio of the first data clock signal WCK and the second data clock signal WCKB upon receiving the data DATA that are generated by detecting or determining the duty ratio of the first data clock signal WCK and the second data clock signal WCKB after the start of a duty monitoring operation. The controller 10 monitors the results of the detection or determination of the duty ratio of the first data clock signal WCK and the second data clock signal WCKB in response to receiving the data DATA that are generated in response to detecting or determining the duty ratio of the first data clock signal WCK and the second data clock signal WCKB after the start of a duty monitoring operation. The controller 10 adjusts the duty ratio of the first data clock signal WCK and the second data clock signal WCKB based on the data DATA after the start of a duty monitoring operation. The controller 10 receives the data DATA after the start of a read operation and outputs the data DATA to an external device (e.g., a host).

The semiconductor device 20 generates the duty information signal (DTD in FIG. 2) in response to receiving the first data clock signal WCK and the second data clock signal WCKB in phase or in reverse phase and detecting or determining the duty ratio of the first data clock signal WCK and the second data clock signal WCKB after the start of a duty monitoring operation. The semiconductor device 20 generates the data DATA from the duty information signal (DTD in FIG. 2) and outputs the data DATA to the controller 10 after the start of a duty monitoring operation. The semiconductor device 20 outputs, to the controller 10, the data DATA that are generated by latching and aligning the first internal data, the second internal data, the third internal data, and the fourth internal data (ID1, ID2, ID3, and ID4 in FIG. 2) in synchronization with the first data clock signal WCK and the second data clock signal WCKB after the start of a read operation.

Figure 2:
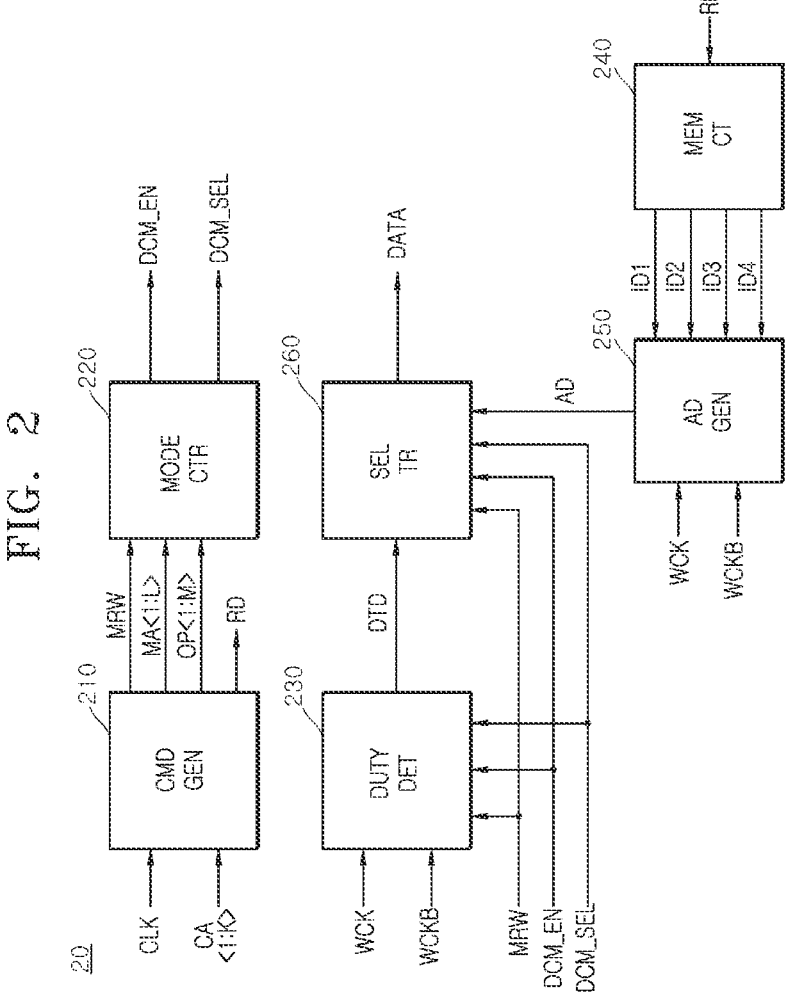
FIG. 2 is a block diagram illustrating an embodiment of a semiconductor device.

FIG. 2 is a block diagram illustrating an embodiment of the semiconductor device 20 such as in the semiconductor system 1. The semiconductor device 20 includes a command generation circuit (CMD GEN) 210, a mode control circuit (MODE CTR) 220, a duty ratio detection circuit (DUTY DET) 230, a memory circuit (MEM CT) 240, an alignment data generation circuit (AD GEN) 250, and a selection transfer circuit (SEL TR) 260.

The command generation circuit 210 generates the mode register command MRW, the read command RD, first mode control signal through L-th mode control signal MA<1:L>, and first operation control signal through M-th operation control signal OP<1:M>, based on a first command address through a K-th command address CA<1:K> in synchronization with the clock signal CLK, where each of K, L, and M is an integer having a value 1 or greater. The command generation circuit 210 generates the mode register command MRW that is enabled when the first command address through the K-th command address CA<1:K> have a first logic level combination for performing a duty monitoring operation in synchronization with the clock signal CLK. The command generation circuit 210 generates the read command RD that is enabled when the first command address through the K-th command address CA<1:K> have a second logic level combination for performing a read operation in synchronization with the clock signal CLK. The command generation circuit 210 generates the first mode control signal through the L-th mode control signal MA<1:L> based on at least one bit of the first command address through the K-th command address CA<1:K> that are input in synchronization with the clock signal CLK after the start of a duty monitoring operation. The command generation circuit 210 generates the first mode control signal through the L-th mode control signal MA<1:L> based on at least one bit of the first command address through the K-th command address CA<1:K> for enabling the duty monitoring enable signal DCM-EN after the start of a duty monitoring operation. The command generation circuit 210 generates the first mode control signal through the L-th mode control signal MA<1:L> based on at least one bit of the first command address through the K-th command address CA<1:K> for disabling the duty monitoring enable signal DCM-EN after the start of a duty monitoring operation. The command generation circuit 210 generates first operation control signal through the M-th operation control signal OP<1:M> based on at least one bit of the first command address through the K-th command address CA<1:K> that are input in synchronization with the clock signal CLK after the start of a duty monitoring operation. The command generation circuit 210 generates the first operation control signal through the M-th operation control signal OP<1:M> based on at least one bit of the first command address through the K-th command address CA<1:K>, which include information for receiving the first data clock signal WCK and the second data clock signal WCKB in phase or in reverse phase, after the start of a duty monitoring operation. The first logic level combination and second logic level combination of the first command address through the K-th command address CA<1:K> for generating the mode register command MRW and the read command RD may utilize any of various different logic level combinations.

The mode control circuit 220 generates the monitoring enable signal DCM_EN based on the mode register command MRW and the first mode control signal through the L-th mode control signal MA<1:L>. The mode control circuit 220 generates the monitoring enable signal DCM-EN that is enabled when the mode register command MRW is enabled and the first mode control signal through the L-th mode control signal MA<1:L> have a logic level combination that enables the monitoring enable signal DCM_EN. The mode control circuit 220 generates the monitoring enable signal DCM_EN that is disabled when the mode register command MRW is enabled and the first mode control signal through the L-th mode control signal MA<1:L> have a logic level combination that disables the monitoring enable signal DCM_EN. The mode control circuit 220 generates the phase selection signal DCM_SEL based on the mode register command MRW and the first operation control signal through the M-th operation control signal OP<1:M>. The mode control circuit 220 generates the phase selection signal DCM_SEL that is enabled when the mode register command MRW is enabled and the first operation control signal through the M-th operation control signal OP<1:M> have a logic level combination for receiving the first data clock signal WCK and the second data clock signal WCKB in phase. The mode control circuit 220 generates the phase selection signal DCM_SEL that is disabled when the mode register command MRW is enabled and the first operation control signal through the M-th operation control signal OP<1:M> have a logic level combination for receiving the first data clock signal WCK and the second data clock signal WCKB in reverse phase. An operation for receiving the first data clock signal WCK and the second data clock signal WCKB in phase is an operation including generating an input clock signal (ICK in FIG. 3) in response to receiving the first data clock signal WCK and generating an inverted input clock signal (ICKB in FIG. 3) in response to receiving the second data clock signal WCKB. An operation for receiving the first data clock signal WCK and the second data clock signal WCKB in reverse phase is an operation including generating the inverted input clock signal (ICKB in FIG. 3) in response to receiving the first data clock signal WCK and generating the input clock signal (ICK in FIG. 3) in response to receiving the second data clock signal WCKB.

The duty ratio detection circuit 230 generates the duty information signal DTD by determining or detecting the duty ratio of the first data clock signal WCK and the second data clock signal WCKB based on the mode register command MRW, the duty monitoring enable signal DCM_EN, and the phase selection signal DCM_SEL. The duty ratio detection circuit 230 generates the duty information signal DTD in response to receiving the first data clock signal WCK and the second data clock signal WCKB in phase or in reverse phase based on the phase selection signal DCM_SEL and detecting or determining the duty ratio of the first data clock signal WCK and the second data clock signal WCKB when the mode register command MRW is enabled and during a time period when the duty monitoring enable signal DCM_EN is enabled after the start of a duty monitoring operation. The duty ratio detection circuit 230 generates the duty information signal DTD in response to receiving the first data clock signal WCK and the second data clock signal WCKB in phase and detecting or determining the duty ratio of the first data clock signal WCK and the second data clock signal WCKB when the phase selection signal DCM_SEL is enabled. The duty ratio detection circuit 230 generates the duty information signal DTD in response to receiving the first data clock signal WCK and the second data clock signal WCKB in reverse phase and detecting or determining the duty ratio of the first data clock signal WCK and the second data clock signal WCKB when the phase selection signal DCM_SEL is disabled.

The memory circuit 240 may be implemented as a known memory circuit including a plurality of memory cells. The memory circuit 240 outputs the first internal data ID1, the second internal data ID2, the third internal data ID3, and the fourth internal data ID4 that are stored in the plurality of memory cells when a read command RD is enabled. The first internal data ID1, the second internal data ID2, the third internal data ID3, and the fourth internal data ID4 may each include a plurality of bits and may be generated in parallel. The memory circuit 240 outputs the first internal data ID1, the second internal data ID2, the third internal data ID3, and the fourth internal data ID4 after the start of a read operation, but may store the first internal data ID1, the second internal data ID2, the third internal data ID3, and the fourth internal data ID4 in the plurality of memory cells after the start of a write operation according to an embodiment.

The alignment data generation circuit 250 generates alignment data AD by latching and aligning the first internal data ID1, the second internal data ID2, the third internal data ID3, and the fourth internal data ID4 in synchronization with the first data clock signal WCK and the second data clock signal WCKB. The alignment data generation circuit 250 generates the alignment data AD by latching and aligning the first internal data ID1, the second internal data ID2, the third internal data ID3, and the fourth internal data ID4 in synchronization with a first division clock signal (DCK1 in FIG. 6), a second division clock signal (DCK2 in FIG. 6), a third division clock signal (DCK3 in FIG. 6), and a fourth division clock signal (DCK4 in FIG. 6) that are generated by dividing the frequencies of the first data clock signal WCK and the second data clock signal WCKB. The alignment data generation circuit 250 latches the first internal data ID1, the second internal data ID2, the third internal data ID3, and the fourth internal data ID4 that are generated in parallel in synchronization with the first division clock signal (DCK1 in FIG. 6), the second division clock signal (DCK2 in FIG. 6), the third division clock signal (DCK3 in FIG. 6), and the fourth division clock signal (DCK4 in FIG. 6), respectively, which clock signals are generated by dividing the frequencies of the first data clock signal WCK and the second data clock signal WCKB. The alignment data generation circuit 250 generates the alignment data AD by in-series aligning the first internal data ID1, the second internal data ID2, the third internal data ID3, and the fourth internal data ID4 that are latched. The alignment data generation circuit 250 may be implemented as a known deserializer that latches a plurality of data that are received in parallel and that outputs the plurality of latched data in series.

The selection transfer circuit 260 generates the data DATA from one of the duty information signal DTD and the alignment data AD based on the duty monitoring enable signal DCM_EN and the mode register command MRW. The selection transfer circuit 260 generates the data DATA from the duty information signal DTD and outputs the data DATA to the controller 10 during a time period when the duty monitoring enable signal DCM_EN is enabled when the mode register command MRW is enabled. The selection transfer circuit 260 generates the data DATA from the alignment data AD and outputs the data DATA to the controller 10 during the time period when the duty monitoring enable signal DCM_EN is disabled.

The semiconductor device 20 generates the duty information signal DTD in response to receiving the first data clock signal WCK and the second data clock signal WCKB in phase or in reverse phase and detecting or determining the duty ratio of the first data clock signal WCK and the second data clock signal WCKB after the start of a duty monitoring operation. The semiconductor device 20 generates the data DATA from the duty information signal DTD and output the data DATA to the controller 10 after the start of a duty monitoring operation. The semiconductor device 20 outputs, to the controller 10, the data DATA that are generated by latching and aligning the first internal data ID1, the second internal data ID2, the third internal data ID3, and the fourth internal data ID4 in synchronization with the first data clock signal WCK and the second data clock signal WCKB after the start of a read operation.

Figure 3:
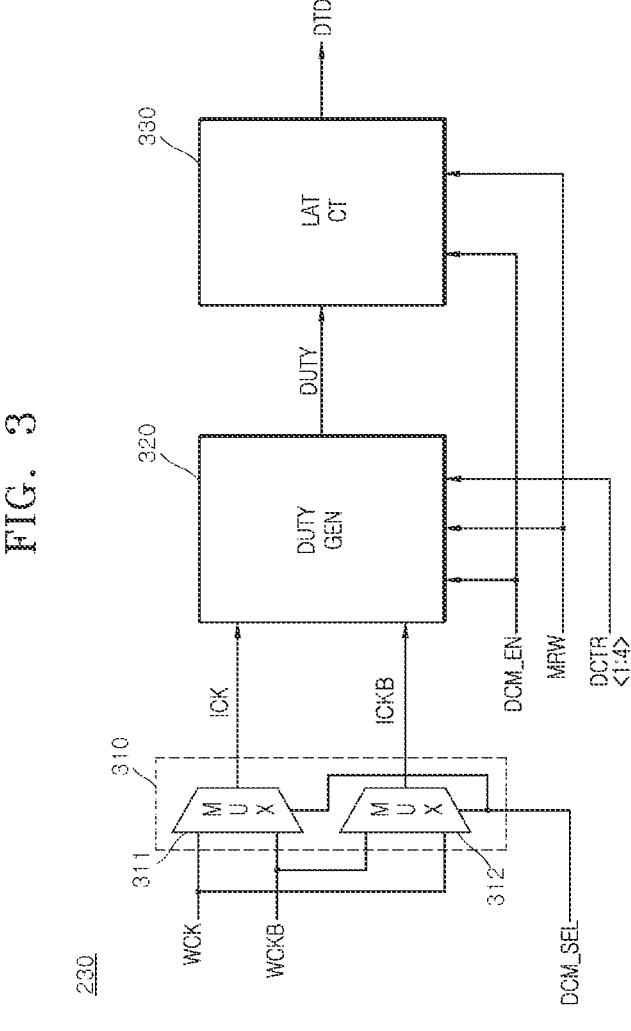
FIG. 3 is a block diagram illustrating embodiment of a duty ratio detection circuit.

FIG. 3 is a block diagram illustrating an embodiment of the duty ratio detection circuit 230 such as in the semiconductor device 20. The duty ratio detection circuit 230 includes a clock input circuit 310, a duty detection signal generation circuit (DUTY GEN) 320, and a latch circuit (LAT CT) 330.

The clock input circuit 310 includes a first clock input circuit (MUX) 311 and a second clock input circuit (MUX) 312. The first clock input circuit 311 outputs the first data clock signal WCK as an input clock signal ICK when the phase selection signal DCM_SEL is enabled at a logic high level. The first clock input circuit 311 outputs the second data clock signal WCKB as the input clock signal ICK when the phase selection signal DCM_SEL is disabled at a logic low level. The second clock input circuit 312 outputs the second data clock signal WCKB as an inverted input clock signal ICKB when the phase selection signal DCM_SEL is enabled at a logic high level. The second clock input circuit 312 outputs the first data clock signal WCK as the inverted input clock signal ICKB when the phase selection signal DCM_SEL is disabled at a logic low level. The clock input circuit 310 generates the input clock signal ICK from any one of the first data clock signal WCK and the second data clock signal WCKB and generates the inverted input clock signal ICKB from any one of the first data clock signal WCK and the second data clock signal WCKB based on the phase selection signal DCM_SEL. The clock input circuit 310 generates the input clock signal ICK from the first data clock signal WCK and generates the inverted input clock signal ICKB from the second data clock signal WCKB when the phase selection signal DCM_SEL is enabled at a logic high level. The clock input circuit 310 generates the input clock signal ICK from the second data clock signal WCKB and generates the inverted input clock signal ICKB from the first data clock signal WCK when the phase selection signal DCM_SEL is disabled at a logic low level.

The duty determination signal generation circuit 320, also referred to as a duty detection signal generation circuit 320, generates a duty detection signal DUTY by detecting or determining the duty ratio of the input clock signal ICK and the inverted input clock signal ICKB based on the duty monitoring enable signal DCM_EN, the mode register command MRW and first to fourth driving control signal DCTR<1:4>. The duty detection signal generation circuit 320 generates the duty detection signal DUTY by detecting or determining the duty ratio of the input clock signal ICK and the inverted input clock signal ICKB after the mode register command MRW is enabled at a logic high level during a time period when the duty monitoring enable signal DCM_EN is enabled at a logic high level, based on the first to fourth driving control signal DCTR<1:4>. The first to fourth driving control signal DCTR<1:4> may be set as signals to form current paths and regulate the discharge of the nodes. The first to fourth driving control signal DCTR<1:4> may be set as signals input from the controller 10.

The latch circuit 330 generates the duty information signal DTD from the duty detection signal DUTY based on the duty monitoring enable signal DCM_EN and the mode register command MRW. The latch circuit 330 generates the duty information signal DTD that is (reset) at a logic low level when the duty monitoring enable signal DCM_EN is at a logic low level. The latch circuit 330 latches the duty detection signal DUTY when the mode register command MRW is enabled at a logic high level during a time period when the duty monitoring enable signal DCM_EN is enabled at a logic high level. The latch circuit 330 outputs, as the duty information signal DTD, the duty detection signal DUTY that is latched when the mode register command MRW is enabled at a logic high level by inverting the duty detection signal DUTY during the time period when the duty monitoring enable signal DCM_EN is enabled at a logic high level.

Figure 4:
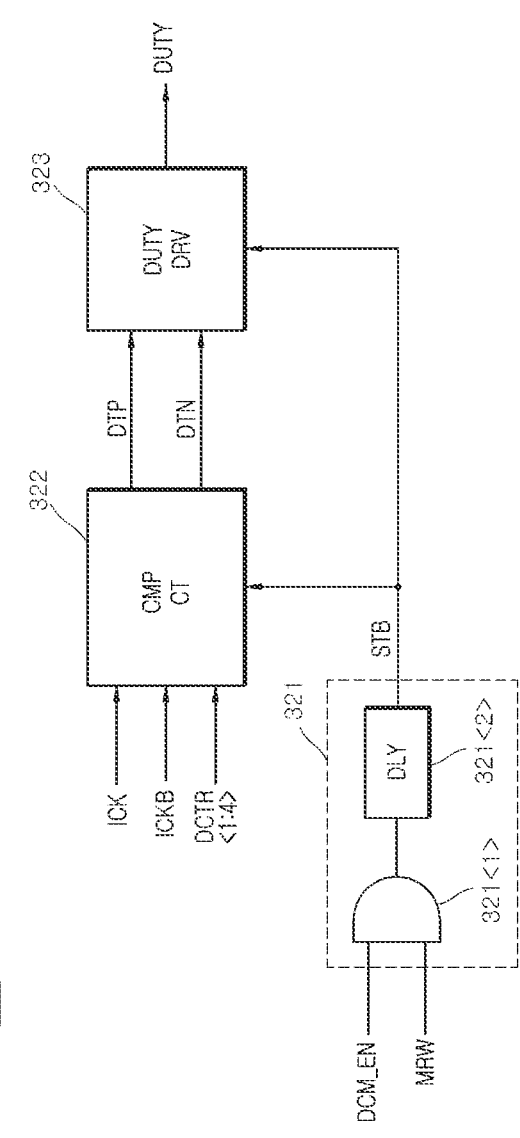
FIG. 4 is a diagram illustrating an embodiment of a duty detection signal generation circuit.

FIG. 4 is a diagram illustrating an embodiment of the duty detection signal generation circuit 320 such as in the duty ratio detection circuit 230. The duty detection signal generation circuit 320 includes a strobe signal generation circuit 321, a comparison circuit (CMP CT) 322, and a duty detection signal driving circuit (DUTY DRV) 323.

The strobe signal generation circuit 321 is implemented with an AND gate 321<1> and a delay circuit (DLY) 321<2> in the example of FIG. 4. The strobe signal generation circuit 321 generates a strobe signal STB by delaying the mode register command MRW during a time period when the duty monitoring enable signal DCM_EN is enabled at a logic high level. The strobe signal generation circuit 321 generates the strobe signal STB that is enabled at a logic high level after a period of delay according to the delay circuit 321<2> from timing at which the mode register command MRW is enabled at a logic high level during the time period when the duty monitoring enable signal DCM_EN is enabled at a logic high level. The strobe signal generation circuit 321 generates the strobe signal STB that is disabled at a logic low level when the mode register command MRW is disabled at a logic low level during the time period when the duty monitoring enable signal DCM_EN is enabled at a logic high level.

The comparison circuit 322 forms a current path based on a first driving control signal through a fourth driving control signal DCTR<1:4>. The comparison circuit 322 generates, in relation to the strobe signal STB, a first duty pulse DTP and a second duty pulse DTN based on the amount of charge that is discharged through the current path according to the duty ratio of the input clock signal ICK and the inverted input clock signal ICKB. The comparison circuit 322 drives the first duty pulse DTP and the second duty pulse DTN to the voltage level of a source voltage (VDD in FIG. 5) when the strobe signal STB is disabled. The comparison circuit 322 generates the first duty pulse DTP at a logic low level and the second duty pulse DTN at a logic high level when the strobe signal STB is enabled and when, during a time period, the period of time during which the input clock signal ICK is at a logic high level is greater than the period of time during which the inverted input clock signal ICKB is at a logic high level. The comparison circuit 322 generates the first duty pulse DTP at a logic high level and the second duty pulse DTN at a logic low level when the strobe signal STB is enabled and when, during a time period, the period of time during which the inverted input clock signal ICKB is at a logic high level is greater than the period of time during which the input clock signal ICK is at a logic high level.

The duty detection signal driving circuit 323 resets the level of the duty detection signal DUTY at a logic high level when the strobe signal STB is enabled at a logic high level. The duty detection signal driving circuit 323 generates the duty detection signal DUTY that is disabled at a logic low level when the first duty pulse DTP is generated at a logic low level. The duty detection signal driving circuit 323 generates the duty detection signal DUTY that is enabled at a logic high level when the second duty pulse DTN is generated at a logic low level. The duty detection signal driving circuit 323 generates the duty detection signal DUTY that is disabled at a logic low level from the time when the first duty pulse DTP is generated at a logic low level to the time when the second duty pulse DTN is generated at a logic low level.

Figure 5:
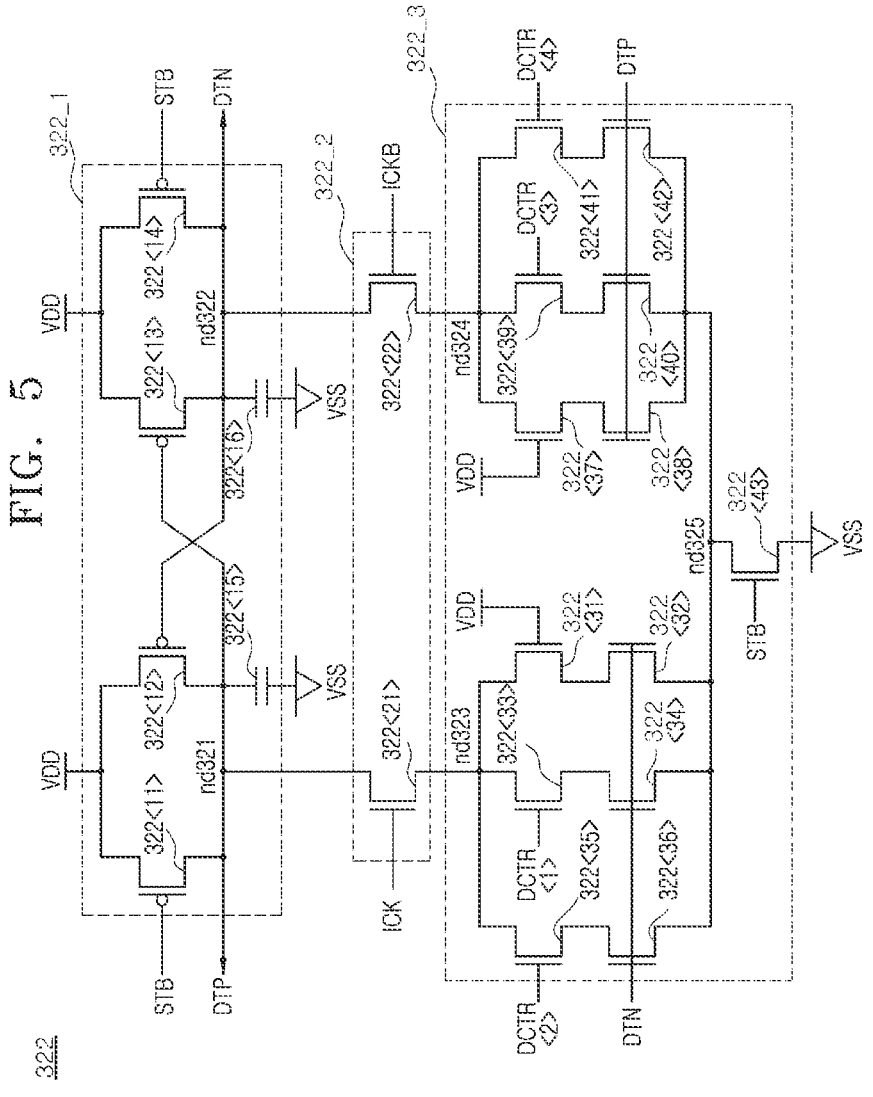
FIG. 5 is a circuit diagram illustrating an embodiment of a comparison circuit.

FIG. 5 is a circuit diagram illustrating an embodiment of the comparison circuit 322 such as in the duty detection signal generation circuit 320. The comparison circuit 322 includes a charge supply circuit 322_1, a first charge discharge circuit 322_2, and a second charge discharge circuit 322_3.

In the example of FIG. 5, the charge supply circuit 322_1 is implemented with a PMOS transistor 322<11> that is connected between the source voltage VDD and a node nd321, a PMOS transistor 322<12> that is connected between the source voltage VDD and the node nd321, a PMOS transistor 322<13> that is connected between the source voltage VDD and a node nd322, a PMOS transistor 322<14> that is connected between the source voltage VDD and the node nd322, a capacitor 322<15> that is connected between the node nd321 and a ground voltage VSS, and a capacitor 322<16> that is connected between the node nd322 and the ground voltage VSS. The PMOS transistor 322<11> is turned on when the strobe signal STB is disabled at a logic low level and generates the first duty pulse DTP at a logic high level by driving the node nd321 at the voltage level of the source voltage VDD. The PMOS transistor 322<14> is turned on when the strobe signal STB is disabled at a logic low level and generates the second duty pulse DTN at a logic high level by driving the node nd322 at the voltage level of the source voltage VDD. The PMOS transistor 322<12> is turned on when the node nd322 is discharged and the second duty pulse DTN is generated at a logic low level and drives the node nd321 to the voltage level of the source voltage VDD. The PMOS transistor 322<13> is turned on when the node nd321 is discharged and the first duty pulse DTP is generated at a logic low level and drives the node nd322 at the voltage level of the source voltage VDD. The capacitor 322<15> stores the charge of the node nd321. The capacitor 322<16> stores the charge of the node nd322. The capacitor 322<15> and the capacitor 322<16> may be implemented with different size capacitors and may be implemented to store different amounts of charge according to an embodiment.

In the example of FIG. 5, the charge supply circuit 322_1 generates the first duty pulse DTP at a logic high level and the second duty pulse DTN at a logic high level by driving the node nd321 and the node nd322 at the voltage level of the source voltage VDD when the strobe signal STB is disabled at a logic low level. The charge supply circuit 322_1 generates the first duty pulse DTP at a logic high level by driving the node nd321 at the voltage level of the source voltage VDD when the node nd322 is discharged and the second duty pulse DTN is generated at a logic low level. The charge supply circuit 322_1 generates the second duty pulse DTN at a logic high level by driving the node nd322 at the voltage level of the source voltage VDD when the node nd321 is discharged and the first duty pulse DTP is generated at a logic low level.

In the example of FIG. 5, the first charge discharge circuit 322_2 is implemented with an NMOS transistor 322<21> that is connected between the node nd321 and a node nd323 and an NMOS transistor 322<22> that is connected between the node nd322 and a node nd324. The NMOS transistor 322<21> discharges the node nd321 to the node nd323 during a time period when the input clock signal ICK is generated at a logic high level. The NMOS transistor 322<22> discharges the node nd322 to the node nd324 during a time period when the inverted input clock signal ICKB is generated at a logic high level. The first charge discharge circuit 322_2 discharges the node nd321 and the node nd322 to the node nd323 and the node nd324, respectively, based on the duty ratio of the input clock signal ICK and the inverted input clock signal ICKB.

In the example of FIG. 5, the second charge discharge circuit 322_3 is implemented with an NMOS transistor 322<31> and an NMOS transistor 322<32> that are connected in series between the node nd323 and a node nd325, an NMOS transistor 322<33> and an NMOS transistor 322<34> that are connected in series between the node nd323 and the node nd325, an NMOS transistor 322<35> and an NMOS transistor 322<36> that are connected in series between the node nd323 and the node nd325, an NMOS transistor 322<37> and an NMOS transistor

322<38> that are connected in series between the node nd324 and the node nd325, an NMOS transistor 322<39> and an NMOS transistor 322<40> that are connected in series between the node nd324 and the node nd325, an NMOS transistor 322<41> and an NMOS transistor 322<42> that are connected in series between the node nd324 and the node nd325, and an NMOS transistor 322<43> that is connected between the node nd325 and the ground voltage VSS. The NMOS transistor 322<31> is turned on when supplied with the source voltage VDD. The NMOS transistor 322<32> is turned on when the second duty pulse DTN is at a logic high level. The NMOS transistor 322<31> and the NMOS transistor 322<32> discharges the node nd323 to the node nd325 when the second duty pulse DTN is at a logic high level. The NMOS transistor 322<33> is turned on when the first driving control signal DCTR<1> is at a logic high level. The NMOS transistor 322<34> is turned on when the second duty pulse DTN is at a logic high level. The NMOS transistor 322<33> and the NMOS transistor 322<34> discharges the node nd323 to the node nd325 by forming a first current path when the first driving control signal DCTR<1> and the second duty pulse DTN are at a logic high level. The NMOS transistor 322<35> is turned on when the second driving control signal DCTR<2> is at a logic high level. The NMOS transistor 322<36> is turned on when the second duty pulse DTN is at a logic high level. The NMOS transistor 322<35> and the NMOS transistor 322<36> discharges the node nd323 to the node nd325 by forming a second current path when the second driving control signal DCTR<2> and the second duty pulse DTN are at a logic high level. The NMOS transistor 322<37> is turned on when supplied with the source voltage VDD. The NMOS transistor 322<38> is turned on when the first duty pulse DTP is at a logic high level. The NMOS transistor 322<37> and the NMOS transistor 322<38> discharges the node nd324 to the node nd325 when the first duty pulse DTP is at a logic high level. The NMOS transistor 322<39> is turned on when the third driving control signal DCTR<3> is at a logic high level. The NMOS transistor 322<40> is turned on when the first duty pulse DTP is at a logic high level. The NMOS transistor 322<39> and the NMOS transistor 322<40> discharges the node nd324 to the node nd325 by forming a third current path when the third driving control signal DCTR<3> and the first duty pulse DTP are at a logic high level. The NMOS transistor 322<41> is turned on when the fourth driving control signal DCTR<4> is at a logic high level. The NMOS transistor 322<42> is turned on when the first duty pulse DTP is at a logic high level. The NMOS transistor 322<41> and the NMOS transistor 322<42> discharges the node nd324 to the node nd325 by forming a fourth current path when the fourth driving control signal DCTR<4> and the first duty pulse DTP are at a logic high level. The NMOS transistor 322<43> discharges the node nd325 to the ground voltage VSS during a time period when the strobe signal STB is generated at a logic high level.

Figure 6:
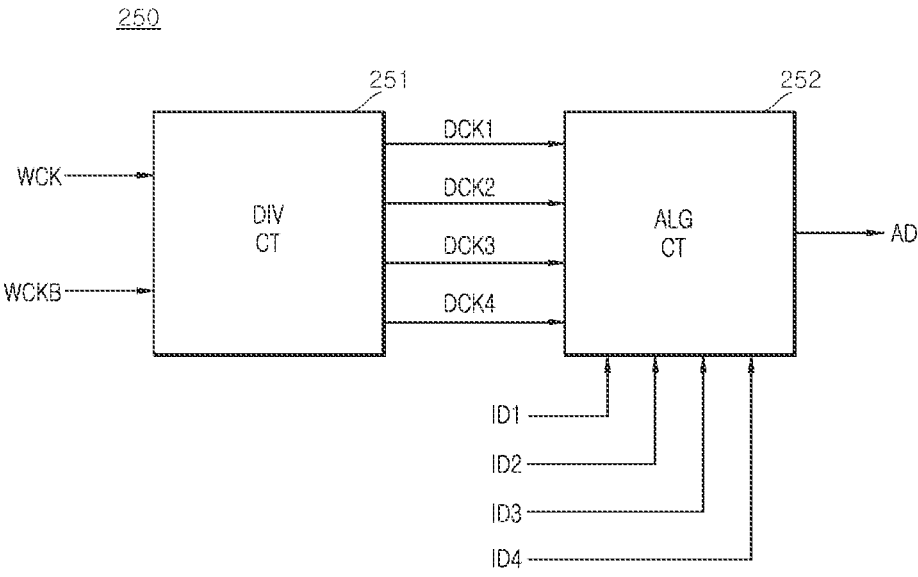
FIG. 6 is a block diagram illustrating an embodiment of an alignment data generation circuit.

FIG. 6 is a block diagram illustrating an embodiment of the alignment data generation circuit 250 such as in the semiconductor device 20. The alignment data generation circuit 250 includes a division circuit (DIV CT) 251 and an alignment circuit (ALG CT) 252.

The division circuit 251 generates the first division clock signal DCK1, the second division clock signal DCK2, the third division clock signal DCK3, and the fourth division clock signal DCK4 by dividing the frequencies of the first data clock signal WCK and the second data clock signal WCKB. The division circuit 251 generates the first division clock signal DCK1, the second division clock signal DCK2, the third division clock signal DCK3, and the fourth division clock signal DCK4, each division clock signal having different phases by dividing the frequencies of the first data clock signal WCK and the second data clock signal WCKB. In one embodiment, the division circuit 251 generates the first division clock signal DCK1 at the same phase as the first data clock signal WCK, generates the second division clock signal DCK2 at a phase that is later than the first division clock signal DCK1 by ¼ period of the first data clock signal WCK, generates the third division clock signal DCK3 at a phase that is later than the second division clock signal DCK2 by ¼ period of the first data clock signal WCK, and generates the fourth division clock signal DCK4 at a phase that is later than the third division clock signal DCK3 by ¼ period of the first data clock signal WCK. The division circuit 251 may be implemented as a known frequency division circuit.

The alignment circuit 252 latches bits that are included in the first internal data ID1 at a time at which the level of the first division clock signal DCK1 transitions from a logic low level to a logic high level and outputs, as the alignment data AD, the latched bits that are included in the first internal data ID1. The alignment circuit 252 latches bits that are included the second internal data ID2 at a time at which the level of the second division clock signal DCK2 transitions from a logic low level to a logic high level and outputs, as the alignment data AD, the latched bits that are included in the second internal data ID2. The alignment circuit 252 latches bits that are included in the third internal data ID3 at a time at which the level of the third division clock signal DCK3 transitions from a logic low level to a logic high level and outputs, as the alignment data AD, the latched bits that are included in the third internal data ID3. The alignment circuit 252 latches bits that are included in the fourth internal data ID4 at a time at which the level of the fourth division clock signal DCK4 transitions from a logic low level to a logic high level and outputs, as the alignment data AD, the latched bits that are included in the fourth internal data ID4. In this example, the alignment circuit 252 latches bits that are included in the first internal data ID1, the second internal data ID2, the third internal data ID3, and the fourth internal data ID4 that are generated in parallel at times at which the levels of the first division clock signal DCK1, the second division clock signal DCK2, the third division clock signal DCK3, and the fourth division clock signal DCK4 transition from a logic low level to a logic high level, respectively, and outputs the latched bits as the alignment data AD.

Figure 7:
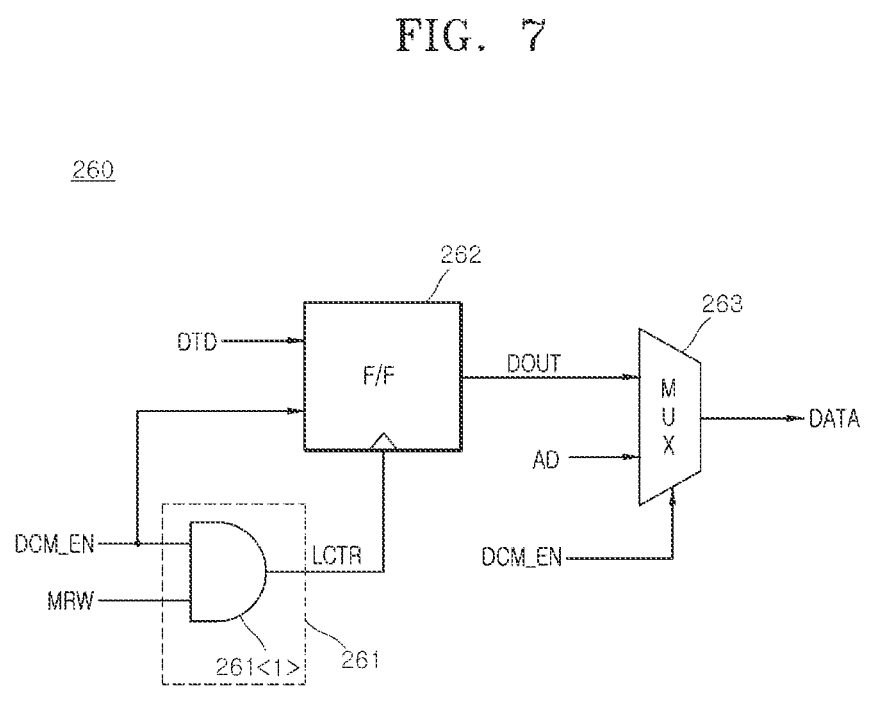

FIG. 7 is a diagram illustrating an embodiment of the selection transfer circuit 260 such as in the semiconductor device 20. The selection transfer circuit 260 includes a latch control signal generation circuit 261, a duty output signal generation circuit (F/F) 262, and a data output circuit (MUX) 263.

The latch control signal generation circuit 261 is implemented with an AND gate 261<1> in the example of FIG. 7. The latch control signal generation circuit 261 generates a latch control signal LCTR that is enabled at a logic high level when the mode register command MRW is generated at a logic high level during a time period when the duty monitoring enable signal DCM_EN is enabled at a logic high level.

The duty output signal generation circuit 262 is implemented as a flip-flop in the example of FIG. 7. The duty output signal generation circuit 262 generates a duty output signal DOUT (reset) at a logic low level when the duty monitoring enable signal DCM_EN is disabled at a logic low level. The duty output signal generation circuit 262 latches the duty information signal DTD when the latch control signal LCTR is enabled at a logic high level. The duty output signal generation circuit 262 outputs, as the duty output signal DOUT, the duty information signal DTD that is latched when the latch control signal LCTR is enabled at a logic high level.

The data output circuit 263 is implemented as a multiplexer is the example of FIG. 7. The data output circuit 263 outputs one of the duty output signal DOUT and the alignment data AD as the data DATA based on the duty monitoring enable signal DCM_EN. The data output circuit 263 output the duty output signal DOUT as the data DATA when the duty monitoring enable signal DCM_EN is enabled at a logic high level. The data output circuit 263 outputs the alignment data AD as the data DATA when the duty monitoring enable signal DCM_EN is disabled at a logic low level.

Figure 8:
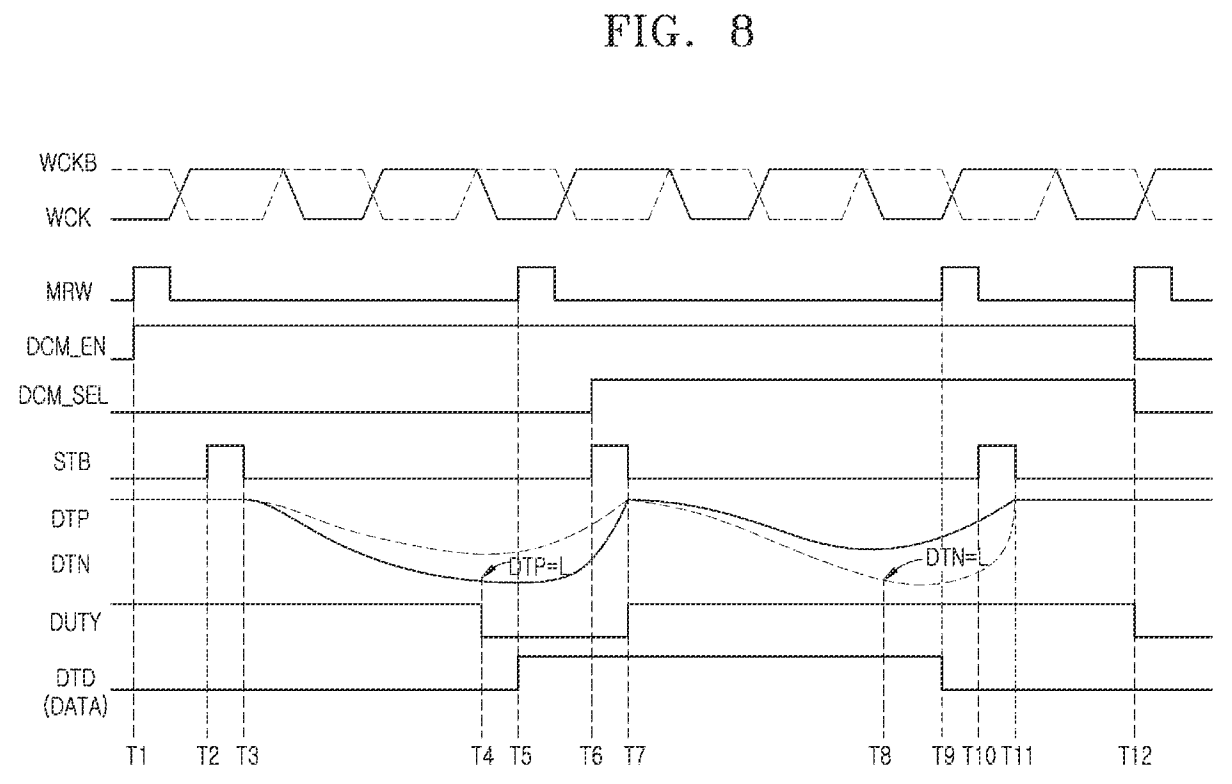

FIG. 8 is a timing diagram illustrating timing of a duty monitoring operation of the semiconductor system 1 according to an embodiment of the present disclosure. The duty monitoring operation according to an embodiment of the present disclosure is described with reference to FIG. 8. In the following example, an operation includes receiving the first data clock signal WCK and the second data clock signal WCKB in reverse phase, receiving the first data clock signal WCK and the second data clock signal WCKB in phase, and detecting or determining the duty ratio of the first data clock signal WCK and the second data clock signal WCKB when a period of time during which the first data clock signal WCK is at a logic high level is greater than a period of time during which the first data clock signal WCK is at a logic low level.

At time T1, the command generation circuit 210 generates the mode register command MRW that is enabled when the first command address through the K-th command address CA<1:K> have a first logic level combination for performing a duty monitoring operation in synchronization with the clock signal CLK. The command generation circuit 210 generates the first mode control signal through the L-th mode control signal MA<1:L> based on at least one bit of the first command address through the K-th command address CA<1:K> that enables the duty monitoring enable signal DCM_EN after the start of a duty monitoring operation. The command generation circuit 210 generates the first operation control signal through the M-th operation control signal OP<1:M> based on at least one bit of the first command address through the K-th command address CA<1:K> including information for receiving the first data clock signal WCK and the second data clock signal WCKB in reverse phase after the start of a duty monitoring operation.

The mode control circuit 220 generates the monitoring enable signal DCM_EN that is enabled at a logic high level when the mode register command MRW is enabled and the first mode control signal through the L-th mode control signal MA<1:L> are at a logic level combination that enables the monitoring enable signal DCM_EN. The mode control circuit 220 generates the phase selection signal DCM_SEL that is disabled at a logic low level when the mode register command MRW is enabled and the first operation control signal through the M-th operation control signal OP<1:M> are at a logic level combination for receiving the first data clock signal WCK and the second data clock signal WCKB in reverse phase.

The clock input circuit 310 generates the input clock signal ICK from the second data clock signal WCKB and generates the inverted input clock signal ICKB from the first data clock signal WCK when the phase selection signal DCM_SEL is disabled at a logic low level.

The comparison circuit 322 of the duty detection signal generation circuit 320 drives the first duty pulse DTP and the second duty pulse DTN at the voltage level of the source voltage (VDD in FIG. 5) when the strobe signal STB is disabled at a logic low level. The first duty pulse DTP is shown as a solid line in FIG. 8, and the second duty pulse DTN is shown as a dashed line in FIG. 8.

At time T2, the strobe signal generation circuit 321 of the duty detection signal generation circuit 320 generates the strobe signal STB at a logic high level by delaying the mode register command MRW that is input at time T1 during a time period when the duty monitoring enable signal DCM_EN is enabled at a logic high level.

At time T3, the comparison circuit 322 of the duty detection signal generation circuit 320 reduces the voltage levels of the first duty pulse DTP and the second duty pulse DTN by the amount of charge that is discharged through a current path according to the duty ratio of the input clock signal ICK and the inverted input clock signal ICKB based on the strobe signal STB that is generated at a logic low level at time T3 after the strobe signal STB is generated at a logic high level at time T2.

At time T4, the comparison circuit 322 of the duty detection signal generation circuit 320 generates the first duty pulse DTP at a logic low level L and the second duty pulse DTN at a logic high level H according to the amount of charge that is discharged through the current path when, during a time period, the input clock signal ICK is at a logic high level for a period of time that is greater than a period of time during which the inverted input clock signal ICKB is at a logic high level.

At time T4, the duty detection signal driving circuit 323 of the duty detection signal generation circuit 320 generate the duty detection signal DUTY that is disabled at a logic low level when the first duty pulse DTP is generated at a logic low level L.

At time T5, the command generation circuit 210 generates the mode register command MRW that is enabled when the first command address through the K-th command address CA<1:K> have the first logic level combination for performing the duty monitoring operation in synchronization with the clock signal CLK. The command generation circuit 210 generates the first mode control signal through the L-th mode control signal MA<1:L> based on at least one bit of the first command address through the K-th command address CA<1:K> for enabling the duty monitoring enable signal DCM_EN after the start of the duty monitoring operation. The command generation circuit 210 generate the first operation control signal through the M-th operation control signal OP<1:M> based on at least one bit of the first command address through the K-th command address CA<1:K> including information for receiving the first data clock signal WCK and the second data clock signal WCKB in phase after the start of the duty monitoring operation.

The latch circuit 330 latches the duty detection signal DUTY at a logic low level when the mode register command MRW is enabled at a logic high level during the time period when the duty monitoring enable signal DCM_EN is enabled at a logic high level and outputs the latched duty detection signal DUTY as the duty information signal DTD by inverting the latched duty detection signal DUTY.

The selection transfer circuit 260 generates the data DATA from the duty information signal DTD and outputs the data DATA to the controller 10 when the mode register command MRW is enabled at a logic high level.

The controller 10 detects or determines a time period during which the first data clock signal WCK is at a logic high level for a greater period of time than a period of time during which the first data clock signal WCK is at a logic low level by detecting or determining the data DATA at a logic high level.

At time T6, the mode control circuit 220 generates the monitoring enable signal DCM_EN that is enabled at a logic high level when the mode register command MRW is enabled and the first mode control signal through the L-th mode control signal MA<1:L> are at a logic level combination that enables the monitoring enable signal DCM_EN. The mode control circuit 220 generates the phase selection signal DCM_SEL that is enabled at a logic high level when the mode register command MRW is enabled and the first operation control signal through the M-th operation control signal OP<1:M> are at a logic level combination for receiving the first data clock signal WCK and the second data clock signal WCKB in phase.

The clock input circuit 310 generates the input clock signal ICK from the first data clock signal WCK and generates the inverted input clock signal ICKB from the second data clock signal WCKB when the phase selection signal DCM_SEL is enabled at a logic high level.

The comparison circuit 322 of the duty detection signal generation circuit 320 drives the first duty pulse DTP and the second duty pulse DTN at the voltage level of the source voltage (VDD in FIG. 5) when the strobe signal STB is disabled at time T7.

The strobe signal generation circuit 321 of the duty detection signal generation circuit 320 generates the strobe signal STB at a logic high level at time T6 by delaying the mode register command MRW that is input at time T5 during the time period when the duty monitoring enable signal DCM_EN is enabled at a logic high level.

At time T7, the duty detection signal driving circuit 323 drives the level of the duty detection signal DUTY at a logic high level after the strobe signal STB is generated at a logic high level at time T6.

At time T7, the comparison circuit 322 of the duty detection signal generation circuit 320 reduces the voltage levels of the first duty pulse DTP and the second duty pulse DTN, for example, by the amount of charge that is discharged through the current path according to the duty ratio of the input clock signal ICK and the inverted input clock signal ICKB after the strobe signal STB is generated at a logic high level from time T6 through time T7.

At time T8, the comparison circuit 322 of the duty detection signal generation circuit 320 generates the first duty pulse DTP at a logic high level H and the second duty pulse DTN at a logic low level L according to the amount of charge that is discharged through the current path when, during a time period, a period of time during which the inverted input clock signal ICKB is at a logic high level is greater than a period of time during which the input clock signal ICK is at a logic high level.

The duty detection signal driving circuit 323 of the duty detection signal generation circuit 320 generates the duty detection signal DUTY that is enabled at a logic high level when the second duty pulse DTN is generated at a logic low level L.

At time T9, the command generation circuit 210 generates the mode register command MRW that is enabled when the first command address through the K-th command address CA<1:K> have the first logic level combination for performing the duty monitoring operation in synchronization with the clock signal CLK.

The latch circuit 330 latches the duty detection signal DUTY at a logic high level when the mode register command MRW is enabled at a logic high level during the time period when the duty monitoring enable signal DCM_EN is enabled at a logic high level and outputs the latched duty detection signal DUTY as the duty information signal DTD by inverting the latched duty detection signal DUTY.

The selection transfer circuit 260 generates the data DATA from the duty information signal DTD and outputs the data DATA to the controller 10 when the mode register command MRW is enabled at a logic high level.

The controller 10 detects or determines a time period during which the first data clock signal WCK is at a logic high level for a greater period of time than a period of time during which the first data clock signal WCK is at a logic low level by detecting or determining the data DATA at a logic high level.

At time T10, the strobe signal STB is enabled at a logic high level, and the comparison circuit 322 of the duty detection signal generation circuit 320 drives the first duty pulse DTP and the second duty pulse DTN to the voltage level of the source voltage (VDD in FIG. 5) when the strobe signal STB is disabled at time T11.

The strobe signal generation circuit 321 of the duty detection signal generation circuit 320 generates the strobe signal STB at a logic high level by delaying the mode register command MRW that is input at time T9 during the time period when the duty monitoring enable signal DCM_EN is enabled at a logic high level.

At time T11, the duty detection signal driving circuit 323 may reset the level of the duty detection signal DUTY to a logic high level after the strobe signal STB that is generated at a logic high level at time T10.

The comparison circuit 322 of the duty detection signal generation circuit 320 drives the first duty pulse DTP and the second duty pulse DTN to the voltage level of the source voltage (VDD in FIG. 5) when the strobe signal STB is disabled at time T11.

At time T12, the command generation circuit 210 generates the mode register command MRW that is enabled when the first command address through the K-th command address CA<1:K> have the first logic level combination for performing the duty monitoring operation in synchronization with the clock signal CLK. The command generation circuit 210 generates the first mode control signal through the L-th mode control signal MA<1:L> based on at least one bit of the first command address through the K-th command address CA<1:K> for disabling the duty monitoring enable signal DCM_EN after the start of the duty monitoring operation. The command generation circuit 210 generates the first operation control signal through the M-th operation control signal OP<1:M> based on at least one bit of the first command address through the K-th command address CA<1:K> including information for receiving the first data clock signal WCK and the second data clock signal WCKB in reverse phase after the start of the duty monitoring operation.

The mode control circuit 220 generates the monitoring enable signal DCM_EN that is disabled at a logic low level when the mode register command MRW is enabled and the first mode control signal through the L-th mode control signal MA<1:L> are at a logic level combination that disables the monitoring enable signal DCM_EN. The mode control circuit 220 generates the phase selection signal DCM_SEL that is disabled at a logic low level when the mode register command MRW is enabled and the first operation control signal through the M-th operation control signal OP<1:M> are at a logic level combination for receiving the first data clock signal WCK and the second data clock signal WCKB in reverse phase.

As described above, the semiconductor system 1 according to an embodiment of the present disclosure may output, to the controller 10, the duty information signal DTD that is generated by detecting or determining the duty ratio of the first data clock signal WCK and the second data clock signal WCKB through the data DATA when the mode register command MRW is enabled during a duty monitoring operation. The semiconductor system 1 may update the duty information signal DTD when the mode register command MRW is enabled during a duty monitoring operation, such that the controller 10 may adjust the duty ratio of the first data clock signal WCK and the second data clock signal WCKB.

Figure 9:
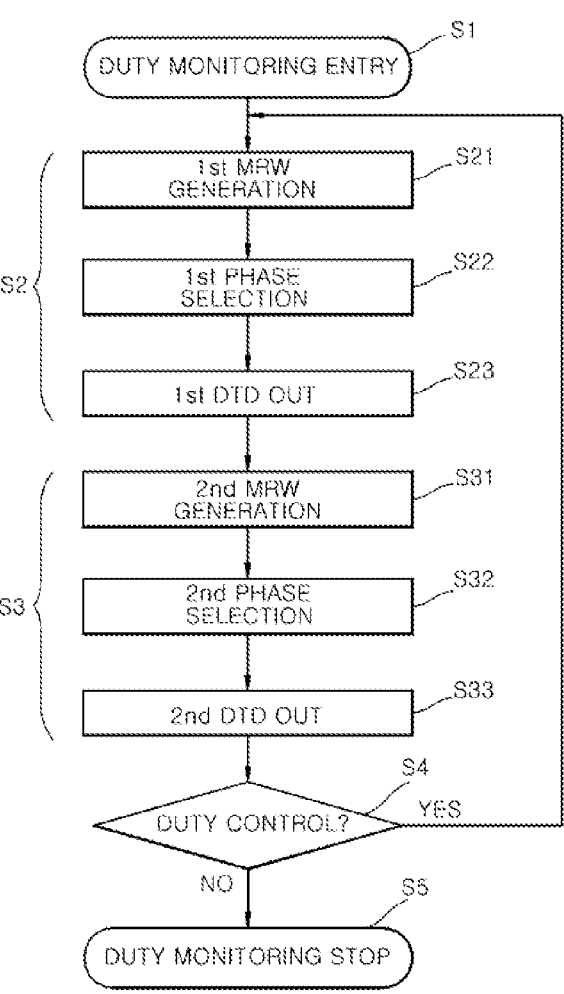
FIG. 9 is a flowchart illustrating a duty monitoring method of the semiconductor system according to an embodiment of the present disclosure.

FIG. 9 is a flowchart illustrating a duty monitoring method of the semiconductor system 1 according to an embodiment of the present disclosure. The duty monitoring method according to an embodiment of the present disclosure includes duty monitoring entry operation S1, a first duty ratio operation S2, a second duty ratio operation S3, duty ratio control operation S4, and duty monitoring operation end S5 in this example.

A duty monitoring entry operation S1 is provided for a duty monitoring method that includes detecting or determining the duty ratio of the first data clock signal WCK and the second data clock signal WCKB and adjusting the duty ratio of the first data clock signal WCK and the second data clock signal WCKB based on the results of the detection or determination.

During the duty monitoring entry operation S1, the controller 10 outputs the first command address through the K-th command address CA<1:K> as a first logic level combination that indicates a start of performing a duty monitoring operation.

During a first duty ratio operation S2, the duty information signal DTD is generated in response to receiving the first data clock signal WCK and the second data clock signal WCKB in phase or in reverse phase according to the phase selection signal DCM_SEL and detecting or determining the duty ratio of the first data clock signal WCK and the second data clock signal WCKB during a time period when the duty monitoring enable signal DCM_EN for performing the duty monitoring operation is enabled.

The first duty ratio operation S2 includes first mode register command generation S21, first phase selection S22, and first duty information output operation S23.

The first mode register command generation S21 includes generating the mode register command MRW and enabling the duty monitoring enable signal DCM_EN based on the first command address through the K-th command address CA<1:K>.

During the first mode register command generation S21, the command generation circuit 210 generates the mode register command MRW that is enabled when the first command address through the K-th command address CA<1:K> have the first logic level combination for performing the duty monitoring operation in synchronization with the clock signal CLK. The command generation circuit 210 generates the first mode control signal through the L-th mode control signal MA<1:L> based on at least one bit of the first command address through the K-th command address CA<1:K> for enabling the duty monitoring enable signal DCM_EN after the start of the duty monitoring operation. During the first mode register command generation S21, the command generation circuit 210 generates the first operation control signal through the M-th operation control signal OP<1:M> based on at least one bit of the first command address through the K-th command address CA<1:K> including information for receiving the first data clock signal WCK and the second data clock signal WCKB in phase or in reverse phase after the start of the duty monitoring operation. During the first mode register command generation S21, the mode control circuit 220 generates the monitoring enable signal DCM_EN that is enabled when the mode register command MRW is enabled and the first mode control signal through the L-th mode control signal MA<1:L> are at a logic level combination that enables the monitoring enable signal DCM_EN.

The first phase selection S22 includes generating the phase selection signal DCM_SEL based on the first command address through the K-th command address CA<1:K> and generating the input clock signal ICK and the inverted input clock signal ICKB in response to receiving the first data clock signal WCK and the second data clock signal WCKB in phase or in reverse phase based on the phase selection signal DCM_SEL.

During the first phase selection S22, the mode control circuit 220 generates the phase selection signal DCM_SEL that is enabled when the mode register command MRW is enabled and the first operation control signal through the M-th operation control signal OP<1:M> have a logic level combination for receiving the first data clock signal WCK and the second data clock signal WCKB in phase. During the first phase selection S22, the mode control circuit 220 generates the phase selection signal DCM_SEL that is disabled when the mode register command MRW is enabled and the first operation control signal through the M-th operation control signal OP<1:M> have a logic level combination for receiving the first data clock signal WCK and the second data clock signal WCKB in reverse phase. During the first phase selection S22, the clock input circuit 310 generates the input clock signal ICK from the first data clock signal WCK and generates the inverted input clock signal ICKB from the second data clock signal WCKB in response to receiving the first data clock signal WCK and the second data clock signal WCKB in phase when the phase selection signal DCM_SEL is enabled at a logic high level. During the first phase selection S22, the clock input circuit 310 generates the input clock signal ICK from the second data clock signal WCKB and generates the inverted input clock signal ICKB from the first data clock signal WCK in response to receiving the first data clock signal WCK and the second data clock signal WCKB in reverse phase when the phase selection signal DCM_SEL is disabled at a logic low level.

The first duty information output operation S23 includes generating the duty information signal DTD by detecting or determining the duty ratio of the input clock signal ICK and the inverted input clock signal ICKB and outputting the data DATA generated from the duty information signal DTD.

During the first duty information output operation S23, the duty detection signal generation circuit 320 generates the duty detection signal DUTY by detecting or determining the duty ratio of the input clock signal ICK and the inverted input clock signal ICKB after the mode register command MRW is enabled at a logic high level during a time period when the duty monitoring enable signal DCM_EN is enabled at a logic high level. During the first duty information output operation S23, the latch circuit 330 latches the duty detection signal DUTY when the mode register command MRW is enabled at a logic high level during the time period when the duty monitoring enable signal DCM_EN is enabled at a logic high level and outputs the latched duty detection signal DUTY as the duty information signal DTD. During the first duty information output operation S23, the selection transfer circuit 260 generates the data DATA from the duty information signal DTD and outputs the data DATA to the controller 10 when the mode register command MRW is enabled during a time period when the duty monitoring enable signal DCM_EN is enabled. During the first duty information output operation S23, the controller 10 detects or determines the duty ratio of the first data clock signal WCK and the second data clock signal WCKB in response to receiving the data DATA and may adjust the duty ratio of the first data clock signal WCK and the second data clock signal WCKB based on the data DATA.

The second duty ratio operation S3 includes generating the duty information signal DTD in response to receiving the first data clock signal WCK and the second data clock signal WCKB in phase or in reverse phase according to the phase selection signal DCM_SEL and detecting or determining the duty ratio of the first data clock signal WCK and the second data clock signal WCKB during a time period when the duty monitoring enable signal DCM_EN for performing the duty monitoring operation is enabled.

The second duty ratio operation S3 includes second mode register command generation S31, second phase selection S32, and second duty information output operation S33.

The second mode register command generation S31 includes generating the mode register command MRW and the duty monitoring enable signal DCM_EN based on the first command address through the K-th command address CA<1:K>.

During the second mode register command generation S31, the command generation circuit 210 generates the mode register command MRW that is enabled when the first command address through the K-th command address CA<1:K> have the first logic level combination for performing the duty monitoring operation in synchronization with the clock signal CLK. During the second mode register command generation S31, the command generation circuit 210 generates the first mode control signal through the L-th mode control signal MA<1:L> based on at least one bit of the first command address through the K-th command address CA<1:K> that enables the duty monitoring enable signal DCM_EN after the start of the duty monitoring operation. During the second mode register command generation S31, the command generation circuit 210 generates the first operation control signal through the M-th operation control signal OP<1:M> based on at least one bit of the first command address through the K-th command address CA<1:K> including information for receiving the first data clock signal WCK and the second data clock signal WCKB in phase or in reverse phase after the start of the duty monitoring operation. During the second mode register command generation S31, the mode control circuit 220 generates the monitoring enable signal DCM_EN that is enabled when the mode register command MRW is enabled and the first mode control signal through the L-th mode control signal MA<1:L> are at a logic level combination that enables the monitoring enable signal DCM_EN.

The second phase selection S32 includes generating the phase selection signal DCM_SEL based on the first command address through the K-th command address CA<1:K> and generating the input clock signal ICK and the inverted input clock signal ICKB in response to receiving the first data clock signal WCK and the second data clock signal WCKB in phase or in reverse phase based on the phase selection signal DCM_SEL.

During the second phase selection S32, the mode control circuit 220 generates the phase selection signal DCM_SEL that is enabled when the mode register command MRW is enabled and the first operation control signal through the M-th operation control signal OP<1:M> have a logic level combination for receiving the first data clock signal WCK and the second data clock signal WCKB in phase. During the second phase selection S32, the mode control circuit 220 generates the phase selection signal DCM_SEL that is disabled when the mode register command MRW is enabled and the first operation control signal through the M-th operation control signal OP<1:M> have a logic level combination for receiving the first data clock signal WCK and the second data clock signal WCKB in reverse phase. During the second phase selection S32, the clock input circuit 310 generates the input clock signal ICK from the first data clock signal WCK and generates the inverted input clock signal ICKB from the second data clock signal WCKB in response to receiving the first data clock signal WCK and the second data clock signal WCKB in phase when the phase selection signal DCM_SEL is enabled at a logic high level. During the second phase selection S32, the clock input circuit 310 generates the input clock signal ICK from the second data clock signal WCKB and generates the inverted input clock signal ICKB from the first data clock signal WCK in response to receiving the first data clock signal WCK and the second data clock signal WCKB in reverse phase when the phase selection signal DCM_SEL is disabled at a logic low level.

The second duty information output operation S33 includes generating the duty information signal DTD by detecting or determining the duty ratio of the input clock signal ICK and the inverted input clock signal ICKB and outputting the data DATA generated from the duty information signal DTD.

During the second duty information output operation S33, the duty detection signal generation circuit 320 generates the duty detection signal DUTY by detecting or determining the duty ratio of the input clock signal ICK and the inverted input clock signal ICKB after the mode register command MRW is enabled at a logic high level during the time period when the duty monitoring enable signal DCM_EN is enabled at a logic high level. During the second duty information output operation S33, the latch circuit 330 latches the duty detection signal DUTY when the mode register command MRW is enabled at a logic high level during the time period when the duty monitoring enable signal DCM_EN is enabled at a logic high level and outputs the latched duty detection signal DUTY as the duty information signal DTD. During the second duty information output operation S33, the selection transfer circuit 260 generates the data DATA from the duty information signal DTD and outputs the data DATA to the controller 10 when the mode register command MRW is enabled during the time period when the duty monitoring enable signal DCM_EN is enabled. During the second duty information output operation S33, the controller 10 detects or determines the duty ratio of the first data clock signal WCK and the second data clock signal WCKB in response to receiving the data DATA and may adjust the duty ratio of the first data clock signal WCK and the second data clock signal WCKB based on the data DATA.

The duty ratio control operation S4 includes ending the duty monitoring operation S5 when the operation of adjust-ing the duty ratio of the first data clock signal WCK and the second data clock signal WCKB is completed (NO) during the second duty ratio operation S3 and entering the first duty ratio operation S2 again when the operation of adjusting the duty ratio of the first data clock signal WCK and the second data clock signal WCKB is not completed (YES) during the second duty ratio operation S3.

The end of the duty monitoring operation S5 includes terminating the duty monitoring operation when the operation of adjusting the duty ratio of the first data clock signal WCK and the second data clock signal WCKB is completed (NO). During the end of the duty monitoring operation S5, the first data clock signal WCK and the second data clock signal WCKB are advantageously generated with a duty ratio of 1:1. An example in which the first data clock signal WCK and the second data clock signal WCKB are generated with a duty ratio of 1:1 indicates that during a time period, the first data clock signal WCK and the second data clock signal WCKB are at a logic high level for the same period of time that the first data clock signal WCK and the second data clock signal WCKB are at a logic low level.

As described above, during the duty monitoring method according to an embodiment of the present disclosure, the duty information signal DTD that is generated by detecting or determining the duty ratio of the first data clock signal WCK and the second data clock signal WCKB when the mode register command MRW is enabled may be output to the controller 10 through the data DATA. During the duty monitoring method, the duty information signal DTD may be updated when the mode register command MRW is enabled during a duty monitoring operation, such that the controller 10 may adjust the duty ratio of the first data clock signal WCK and the second data clock signal WCKB when the duty ratio is, for example, not 1:1 or close enough to 1:1 to provide acceptable performance.

Figure 10:
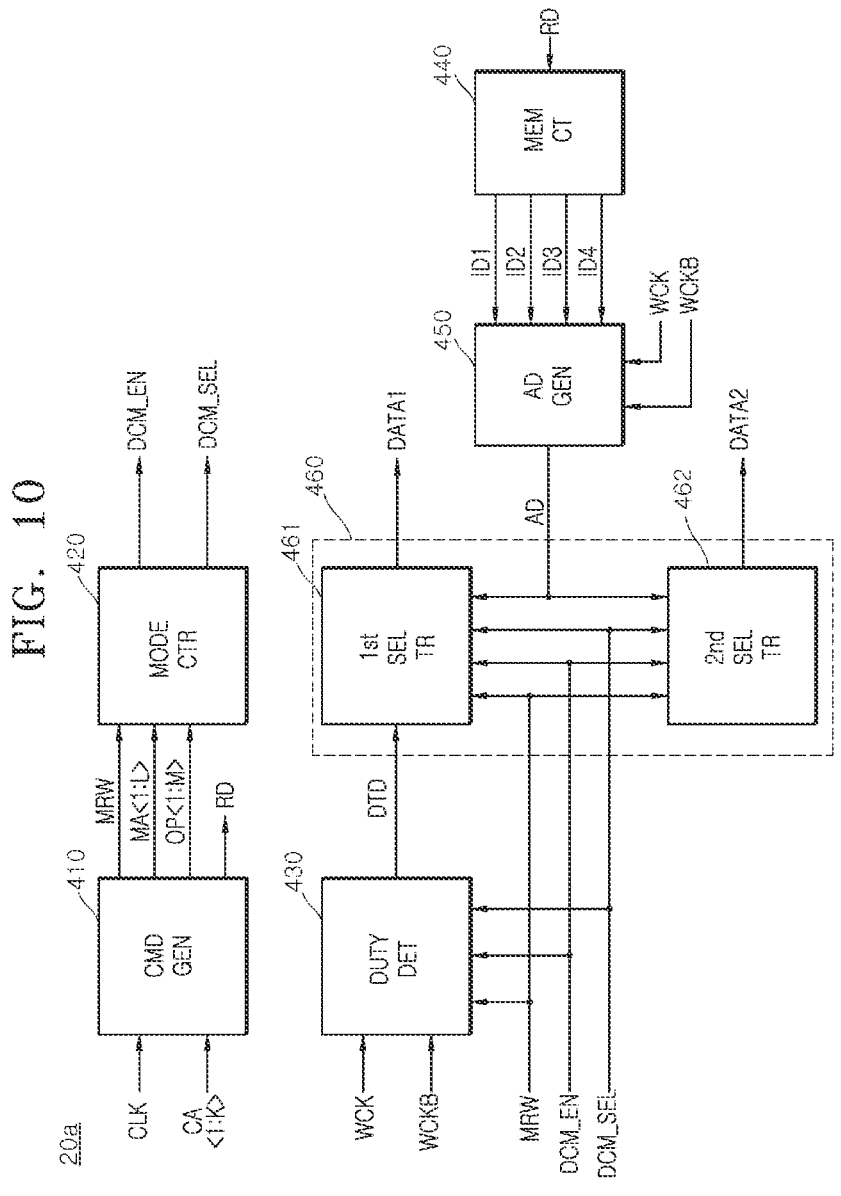
FIG. 10 is a block diagram illustrating another embodiment of a semiconductor device.

FIG. 10 is a block diagram illustrating another embodiment of the semiconductor device 20 such as in the semiconductor system 1. A semiconductor device 20a includes a command generation circuit (CMD GEN) 410, a mode control circuit (MODE CTR) 420, a duty ratio detection circuit (DUTY DET) 430, a memory circuit (MEM CT) 440, an alignment data generation circuit (AD GEN) 450, and a data transfer circuit 460.

The command generation circuit 410 generates a mode register command MRW, a read command RD, first mode control signal through the L-th mode control signal MA<1: L>, and first operation control signal through the M-th operation control signal OP<1:M> based on first command address through the K-th command address CA<1:K> in synchronization with the clock signal CLK. The command generation circuit 410 generates the mode register command MRW that is enabled when the first command address through the K-th command address CA<1:K> have a first logic level combination for performing a duty monitoring operation in synchronization with the clock signal CLK. The command generation circuit 410 generates the read command RD that is enabled when the first command address through the K-th command address CA<1:K> have a second logic level combination for performing a read operation in synchronization with the clock signal CLK. The command generation circuit 410 generates the first mode control signal through the L-th mode control signal MA<1:L> based on at least one bit of the first command address through the K-th command address CA<1:K> that are input in synchronization with the clock signal CLK after the start of a duty monitoring operation. The command generation circuit 410 generates the first mode control signal through the L-th mode control signal MA<1:L> based on at least one bit of the first command address through the K-th command address CA<1:K> that enables a duty monitoring enable signal DCM_EN after the start of a duty monitoring operation. The command generation circuit 410 generates the first mode control signal through the L-th mode control signal MA<1:L> based on at least one bit of the first command address through the K-th command address CA<1:K> for disabling the duty monitoring enable signal DCM_EN after the start of a duty monitoring operation. The command generation circuit 410 generates the first operation control signal through the M-th operation control signal OP<1:M> based on at least one bit of the first command address through the K-th command address CA<1:K> that are input in synchronization with the clock signal CLK after the start of a duty monitoring operation. The command generation circuit 410 generates the first operation control signal through the M-th operation control signal OP<1:M> based on at least one bit of the first command address through the K-th command address CA<1:K> including information for receiving the first data clock signal WCK and the second data clock signal WCKB in phase or in reverse phase after the start of a duty monitoring operation. The first logic level combination of the first command address through the K-th command address CA<1:K> for generating the mode register command MRW and the second logic level combination of the first command address through the K-th command address CA<1:K> for generating the read command RD may each include one of various different logic level combinations.

The mode control circuit 420 generates the monitoring enable signal DCM_EN based on the mode register command MRW and the first mode control signal through the L-th mode control signal MA<1:L>. The mode control circuit 420 generates the monitoring enable signal DCM_EN that is enabled when the mode register command MRW is enabled and the first mode control signal through the L-th mode control signal MA<1:L> are at a logic level combination that enables the monitoring enable signal DCM_EN. The mode control circuit 420 generates the monitoring enable signal DCM_EN that is disabled when the mode register command MRW is enabled and the first mode control signal through the L-th mode control signal MA<1:L> are at a logic level combination that disables the monitoring enable signal DCM_EN. The mode control circuit 420 generates a phase selection signal DCM_SEL based on the mode register command MRW and the first operation control signal through the M-th operation control signal OP<1:M>. The mode control circuit 420 generates the phase selection signal DCM_SEL that is enabled when the mode register command MRW is enabled and the first operation control signal through the M-th operation control signal OP<1:M> have a logic level combination for receiving the first data clock signal WCK and the second data clock signal WCKB in phase. The mode control circuit 420 generates the phase selection signal DCM_SEL that is disabled when the mode register command MRW is enabled and the first operation control signal through the M-th operation control signal OP<1:M> have a logic level combination for receiving the first data clock signal WCK and the second data clock signal WCKB in reverse phase. An operation for receiving the first data clock signal WCK and the second data clock signal WCKB in phase includes an operation of generating the input clock signal (ICK in FIG. 3) in response to receiving the first data clock signal WCK and generating the inverted input clock signal (ICKB in FIG. 3) in response to receiving the second data clock signal WCKB. An operation for receiving the first data clock signal WCK and the second data clock signal WCKB in reverse phase includes an operation of generating the inverted input clock signal (ICKB in FIG. 3) in response to receiving the first data clock signal WCK and generating the input clock signal (ICK in FIG. 3) in response to receiving the second data clock signal WCKB.

The duty ratio detection circuit 430 generates a duty information signal DTD by detecting or determining the duty ratio of the first data clock signal WCK and the second data clock signal WCKB based on the mode register command MRW, the duty monitoring enable signal DCM_EN, and the phase selection signal DCM_SEL. The duty ratio detection circuit 430 generates the duty information signal DTD in response to receiving the first data clock signal WCK and the second data clock signal WCKB in phase or in reverse phase according to the phase selection signal DCM_SEL and detecting or determining the duty ratio of the first data clock signal WCK and the second data clock signal WCKB when the mode register command MRW is enabled and during a time period when the duty monitoring enable signal DCM_EN is enabled after the start of a duty monitoring operation. The duty ratio detection circuit 430 generates the duty information signal DTD in response to receiving the first data clock signal WCK and the second data clock signal WCKB in phase when the phase selection signal DCM_SEL is enabled and detecting or determining the duty ratio of the first data clock signal WCK and the second data clock signal WCKB. The duty ratio detection circuit 430 generates the duty information signal DTD in response to receiving the first data clock signal WCK and the second data clock signal WCKB in reverse phase when the phase selection signal DCM_SEL is disabled and detecting or determining the duty ratio of the first data clock signal WCK and the second data clock signal WCKB. The duty ratio detection circuit 430 may be implemented with the same circuit as the duty ratio detection circuit 230 illustrated in FIG. 3 through FIG. 5 and may perform the same operations as the duty ratio detection circuit 230 as described above.

The memory circuit 440 may be implemented as a known memory circuit including a plurality of memory cells. The memory circuit 440 outputs first internal data ID1, second internal data ID2, third internal data ID3, and fourth internal data ID4 that are stored in a plurality of memory cells when a read command RD is enabled. The first internal data ID1, the second internal data ID2, the third internal data ID3, and the fourth internal data ID4 may each include a plurality of bits and may be generated in parallel. The memory circuit 440 outputs the first internal data ID1, the second internal data ID2, the third internal data ID3, and the fourth internal data ID4 after the start of a read operation, but may store the first internal data ID1, the second internal data ID2, the third internal data ID3, and the fourth internal data ID4 in the plurality of memory cells after the start of a write operation according to an embodiment.

The alignment data generation circuit 450 generates alignment data AD by latching and aligning the first internal data ID1, the second internal data ID2, the third internal data ID3, and the fourth internal data ID4 in synchronization with the first data clock signal WCK and the second data clock signal WCKB. The alignment data generation circuit 450 generates the alignment data AD by latching and aligning the first internal data ID1, the second internal data ID2, the third internal data ID3, and the fourth internal data ID4 in synchronization with the first division clock signal (DCK1 in FIG. 6), the second division clock signal (DCK2 in FIG.

6), the third division clock signal (DCK3 in FIG. 6), and the fourth division clock signal (DCK4 in FIG. 6) that are generated by dividing the frequencies of the first data clock signal WCK and the second data clock signal WCKB. The alignment data generation circuit 450 latches the first internal data ID1, the second internal data ID2, the third internal data ID3, and the fourth internal data ID4 that are generated in parallel in synchronization with the first division clock signal (DCK1 in FIG. 6), the second division clock signal (DCK2 in FIG. 6), the third division clock signal (DCK3 in FIG. 6), and the fourth division clock signal (DCK4 in FIG. 6), respectively, which clock signals are generated by dividing the frequencies of the first data clock signal WCK and the second data clock signal WCKB. The alignment data generation circuit 450 generates the alignment data AD by in-series aligning the first internal data ID1, the second internal data ID2, the third internal data ID3, and the fourth internal data ID4 that are latched. The alignment data generation circuit 450 may be implemented as a known deserializer that latches a plurality of data that are received in parallel and that outputs the plurality of latched data in series. The alignment data generation circuit 450 may be implemented with the same circuit as the alignment data generation circuit 250 illustrated in FIG. 6 and may perform the same operations as the alignment data generation circuit 250 illustrated in FIG. 6 as described above.

The data transfer circuit 460 includes a first selection transfer circuit ($1^{st}$ SEL TR) 461 and a second selection transfer circuit ($2^{nd}$ SEL TR) 462.

The first selection transfer circuit 261 generates first data DATA1 from any one of the duty information signal DTD and the alignment data AD based on the duty monitoring enable signal DCM_EN, the mode register command MRW, and the phase selection signal DCM_SEL. The first selection transfer circuit 261 generates the first data DATA1 from the duty information signal DTD and outputs the first data DATA1 to the controller 10 when the mode register command MRW is enabled and the phase selection signal DCM_SEL is enabled during a time period when the duty monitoring enable signal DCM_EN is enabled. The first selection transfer circuit 261 generates the first data DATA1 from the alignment data AD and outputs the first data DATA1 to the controller 10 during the time period when the duty monitoring enable signal DCM_EN is disabled.

The second selection transfer circuit 262 generates second data DATA2 from any one of the duty information signal DTD and the alignment data AD based on the duty monitoring enable signal DCM_EN, the mode register command MRW, and the phase selection signal DCM_SEL. The second selection transfer circuit 262 generates the second data DATA2 from the duty information signal DTD and outputs the second data DATA2 to the controller 10 when the mode register command MRW is enabled and the phase selection signal DCM_SEL is disabled during a time period when the duty monitoring enable signal DCM_EN is enabled. The second selection transfer circuit 262 generates the second data DATA2 from the alignment data AD and output the second data DATA2 to the controller 10 during the time period when the duty monitoring enable signal DCM_EN is disabled.

The data transfer circuit 460 generates the first data DATA1 from any one of the duty information signal DTD and the alignment data AD based on the duty monitoring enable signal DCM_EN, the mode register command MRW, and the phase selection signal DCM_SEL. The data transfer circuit 460 generates the first data DATA1 from the duty information signal DTD and outputs the first data DATA1 to the controller 10 when the mode register command MRW is enabled and the phase selection signal DCM_SEL is enabled during a time period when the duty monitoring enable signal DCM_EN is enabled. The data transfer circuit 460 generates the first data DATA1 from the alignment data AD and outputs the first data DATA1 to the controller 10 during the time period when the duty monitoring enable signal DCM_EN is disabled. The data transfer circuit 460 generates the second data DATA2 from any one of the duty information signal DTD and the alignment data AD based on the duty monitoring enable signal DCM_EN, the mode register command MRW, and the phase selection signal DCM_SEL. The data transfer circuit 460 generates the second data DATA2 from the duty information signal DTD and outputs the second data DATA2 to the controller 10 when the mode register command MRW is enabled and the phase selection signal DCM_SEL is disabled during the time period when the duty monitoring enable signal DCM_EN is enabled. The data transfer circuit 460 generates the second data DATA2 from the alignment data AD and outputs the second data DATA2 to the controller 10 during the time period when the duty monitoring enable signal DCM_EN is disabled.

After the start of a duty monitoring operation, the semiconductor device 20a generates the duty information signal DTD in response to receiving the first data clock signal WCK and the second data clock signal WCKB in phase or in reverse phase and detecting or determining the duty ratio of the first data clock signal WCK and the second data clock signal WCKB. After the start of a duty monitoring operation, the semiconductor device 20a generates the first data DATA1 from the duty information signal DTD in response to receiving the first data clock signal WCK and the second data clock signal WCKB in phase and outputs the first data DATA1 to the controller 10. After the start of a duty monitoring operation, the semiconductor device 20a generates the second data DATA2 from the duty information signal DTD in response to receiving the first data clock signal WCK and the second data clock signal WCKB in reverse phase and outputs the second data DATA2 to the controller 10. After the start of a read operation, the semiconductor device 20a outputs, to the controller 10, the first data DATA1 and the second data DATA2 that are generated by latching and aligning the first to fourth internal data ID1, ID2, ID3, and ID4 in synchronization with the first data clock signal WCK and the second data clock signal WCKB.

Figure 11:
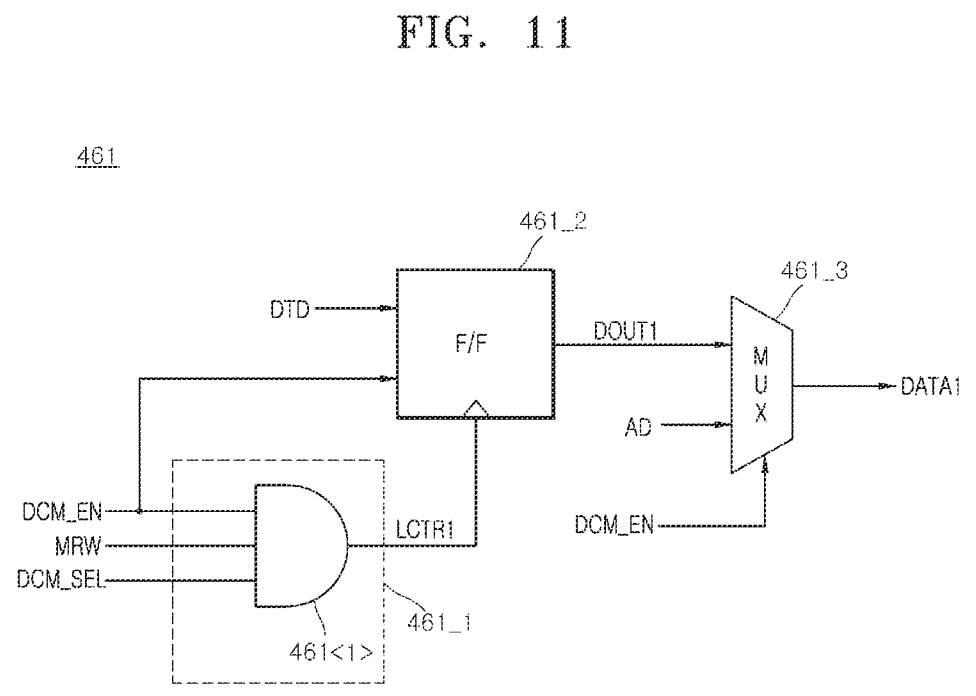

FIG. 11 is a block diagram illustrating an embodiment of the first selection transfer circuit 461 such as included in the semiconductor device 20a. The first selection transfer circuit 461 includes a first latch control signal generation circuit 461_1, a first duty output signal generation circuit (F/F) 461_2, and a first data output circuit (MUX) 461_3.

The first latch control signal generation circuit 461_1 is implemented as an AND gate 461<1> in the example of FIG. 11. The first latch control signal generation circuit 461_1 generates a first latch control signal LCTR1 that is enabled at a logic high level when the mode register command MRW is generated at a logic high level and the phase selection signal DCM_SEL is enabled at a logic high level during a time period when the duty monitoring enable signal DCM_EN is enabled at a logic high level.

The first duty output signal generation circuit 461_2 is implemented as a flip-flop in the example of FIG. 11. The first duty output signal generation circuit 461_2 generates a first duty output signal DOUT1 (reset) at a logic low level when the duty monitoring enable signal DCM_EN is disabled at a logic low level. The first duty output signal generation circuit 461_2 latches the duty information signal DTD when the first latch control signal LCTR1 is enabled at a logic high level. The first duty output signal generation circuit 461_2 outputs, as the first duty output signal DOUT1, the duty information signal DTD that is latched when the first latch control signal LCTR1 is enabled at a logic high level.

The first data output circuit 461_3 is implemented as a multiplexer in the example of FIG. 11. The first data output circuit 461_3 outputs one of the first duty output signal DOUT1 and the alignment data AD as the first data DATA1 based on the duty monitoring enable signal DCM_EN. The first data output circuit 461_3 outputs the first duty output signal DOUT1 as the first data DATA1 when the duty monitoring enable signal DCM_EN is enabled at a logic high level. The first data output circuit 461_3 outputs the alignment data AD as the first data DATA1 when the duty monitoring enable signal DCM_EN is disabled at a logic low level.

Figure 12:
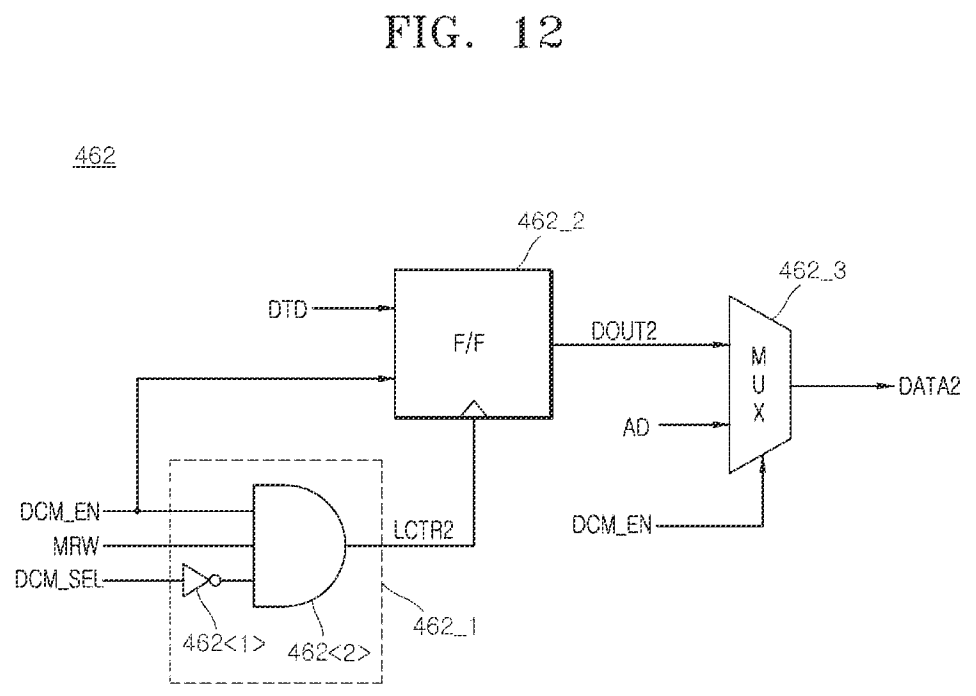

FIG. 12 is a block diagram illustrating an embodiment of the second selection transfer circuit 462 such as included in the semiconductor device 20a. The second selection transfer circuit 462 includes a second latch control signal generation circuit 462_1, a second duty output signal generation circuit (F/F) 462_2, and a second data output circuit (MUX) 462_3.

The second latch control signal generation circuit 462_1 is implemented with an inverter 462<1> and an AND gate 462<2> in the example of FIG. 12. The second latch control signal generation circuit 462_1 generates a second latch control signal LCTR2 that is enabled at a logic high level when the mode register command MRW is generated at a logic high level and the phase selection signal DCM_SEL is disabled at a logic low level during a time period when the duty monitoring enable signal DCM_EN is enabled at a logic high level.

The second duty output signal generation circuit 462_2 is implemented as a flip-flop in the example of FIG. 12. The second duty output signal generation circuit 462_2 generates a second duty output signal DOUT2 (reset) at a logic low level when the duty monitoring enable signal DCM_EN is disabled at a logic low level. The second duty output signal generation circuit 462_2 latches the duty information signal DTD when the second latch control signal LCTR2 is enabled at a logic high level. The second duty output signal generation circuit 462_2 outputs, as the second duty output signal DOUT2, the duty information signal DTD that is latched when the second latch control signal LCTR2 is enabled at a logic high level.

The second data output circuit 462_3 is implemented as a multiplexer in the example of FIG. 12. The second data output circuit 462_3 outputs one of the second duty output signal DOUT2 and the alignment data AD as the second data DATA2 based on the duty monitoring enable signal DCM_EN. The second data output circuit 462_3 outputs the second duty output signal DOUT2 as the second data DATA2 when the duty monitoring enable signal DCM_EN is enabled at a logic high level. The second data output circuit 462_3 outputs the alignment data AD as the second data DATA2 when the duty monitoring enable signal DCM_EN is disabled at a logic low level.

Figure 13:
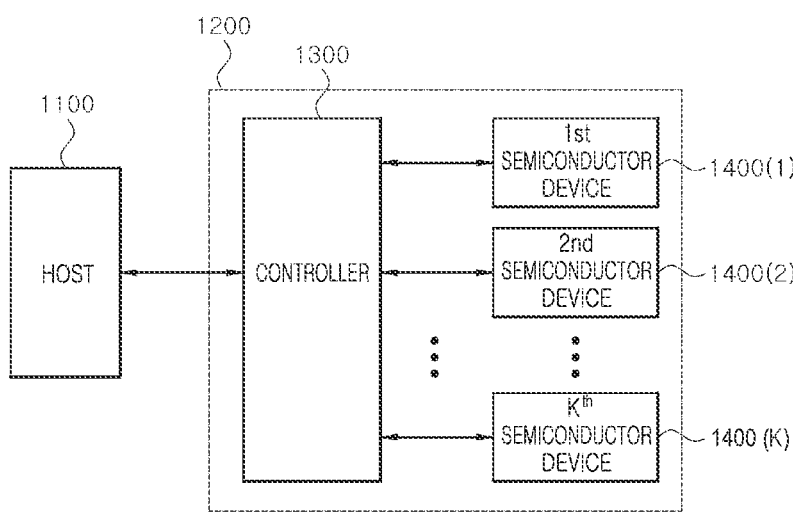
FIG. 13 is a diagram illustrating an embodiment of an electronic system according to an embodiment of the present disclosure.

FIG. 13 is a block diagram illustrating an embodiment of an electronic system 1000 according to an embodiment of the present disclosure. As illustrated in FIG. 13, the electronic system 1000 includes a host 1100 and a semiconductor system 1200.

The host 1100 and the semiconductor system 1200 mutually transmit or communicate signals in both directions using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), and a universal serial bus (USB).

The semiconductor system 1200 includes a controller 1300 and N semiconductor devices 1400(1:K), where N is an integer having a value 1 or greater. The controller 1300 control the semiconductor devices 1400(1:K) such that each of the semiconductor devices 1400(1:K) performs a duty monitoring operation and a read operation. Each of the semiconductor devices 1400(1:K) generates a duty information signal DTD in response to receiving the first data clock signal WCK and the second data clock signal WCKB in phase or in reverse phase and detecting or determining the duty ratio of the first data clock signal WCK and the second data clock signal WCKB after the start of a duty monitoring operation. Each of the semiconductor devices 1400(1:K) generates the data DATA from the duty information signal DTD and outputs the data DATA to the controller 1300 after the start of a duty monitoring operation. Each of the semiconductor devices 1400(1:K) may output, to the controller 1300, the data DATA that are generated by latching and aligning the first internal data ID1, the second internal data ID2, the third internal data ID3, and the fourth internal data ID4 in synchronization with the first data clock signal WCK and the second data clock signal WCKB after the start of a read operation. The controller 1300 detects or determines the duty ratio of the first data clock signal WCK and the second data clock signal WCKB in response to receiving, from the semiconductor devices 1400(1:K), the data DATA that are generated from the duty information signal DTD after the start of a duty monitoring operation. The controller 1300 may monitor the results of the detection or determination of the duty ratio of the first data clock signal WCK and the second data clock signal WCKB in response to receiving the data DATA that are generated by detecting or determining the duty ratio of the first data clock signal WCK and the second data clock signal WCKB after the start of a duty monitoring operation. The controller 1300 may adjust the duty ratio of the first data clock signal WCK and the second data clock signal WCKB in response to receiving, from the semiconductor devices 1400(1:K), the data DATA that are generated from the duty information signal DTD after the start of a duty monitoring operation. After the start of a read operation, the controller 1300 receives the data DATA and outputs the data DATA to the host 1100.

The controller 1300 may be implemented as the controller 10 illustrated in FIG. 1. Each of the semiconductor devices 1400(1:K) may be implemented as the semiconductor device 20 illustrated in FIG. 2 or the semiconductor device 20a illustrated in FIG. 10. According to an embodiment, each of the semiconductor devices 1400(1:K) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:
   a duty ratio determination circuit configured to generate a
   duty information signal in response to receiving a first
   data clock signal and a second data clock signal in
   phase or in reverse phase according to a phase selection signal and determining a duty ratio of the first data clock signal and the second data clock signal during a time period when a duty monitoring enable signal for performing a duty monitoring operation is enabled; and a selection transfer circuit configured to generate data from the duty information signal and configured to output the data to a controller when a mode register command is enabled.

2. The semiconductor device of claim 1, wherein the duty ratio determination circuit is configured to generate an input clock signal from the first data clock signal in response to receiving the first data clock signal and the second data clock signal in phase when the phase selection signal is enabled, to generate an inverted input clock signal from the second data clock signal, and to generate the duty information signal by determining a duty ratio of the input clock signal and the inverted input clock signal; and wherein the duty ratio determination circuit is configured to generate the inverted input clock signal from the first data clock signal in response to receiving the first data clock signal and the second data clock signal in reverse phase when the phase selection signal is disabled, to generate the input clock signal from the second data clock signal, and to generate the duty information signal by determining a duty ratio of the input clock signal and the inverted input clock signal.

3. The semiconductor device of claim 1, wherein the controller is configured to adjust the duty ratio of the first data clock signal and the second data clock signal based on the data after a start of the duty monitoring operation.

4. The semiconductor device of claim 1, wherein the duty ratio determination circuit comprises:

a clock input circuit configured to generate an input clock signal from one of the first data clock signal and the second data clock signal based on the phase selection signal and configured to generate an inverted input clock signal from one of the first data clock signal and the second data clock signal;

a duty detection signal generation circuit configured to generate a duty detection signal by determining a duty ratio of the input clock signal and the inverted input clock signal when the mode register command is enabled during the time period when the duty monitoring enable signal is enabled; and a latch circuit configured to latch the duty detection signal when the mode register command is enabled during the time period when the duty monitoring enable signal is enabled and configured to output, as the duty information signal, the duty detection signal that is latched.

5. The semiconductor device of claim 4, wherein the clock input circuit comprises:

a first clock input circuit configured to output the first data clock signal as the input clock signal when the phase selection signal is enabled and configured to output the second data clock signal as the input clock signal when the phase selection signal is disabled; and a second clock input circuit configured to output the second data clock signal as the inverted input clock signal when the phase selection signal is enabled and configured to output the first data clock signal as the inverted input clock signal when the phase selection signal is disabled.

6. The semiconductor device of claim 4, wherein the duty detection signal generation circuit comprises:

a strobe signal generation circuit configured to generate a strobe signal by delaying the mode register command during the time period when the duty monitoring enable signal is enabled;

a comparison circuit configured to form a current path based on a driving control signal and configured to generate, in relation to the strobe signal, a first duty pulse and a second duty pulse based on an amount of charge that is discharged through the current path according to the duty ratio of the input clock signal and the inverted input clock signal; and a duty detection signal driving circuit configured to reset the duty detection signal when the strobe signal is enabled and configured to generate the duty detection signal that is enabled from a time when the first duty pulse is enabled to a time when the second duty pulse is enabled.

7. The semiconductor device of claim 6, wherein the comparison circuit comprises:

a charge supply circuit configured to drive a first node and a second node from which the first duty pulse and the second duty pulse are output, respectively, to a source voltage when the strobe signal is disabled;

a first charge discharge circuit configured to discharge the first node to a third node and to discharge the second node to a fourth node based on the duty ratio of the input clock signal and the inverted input clock signal; and a second charge discharge circuit configured to form the current path based on the driving control signal and configured to discharge the third node and the fourth node to a ground voltage through the current path based on the first duty pulse and the second duty pulse when the strobe signal is enabled.

8. The semiconductor device of claim 1, wherein the selection transfer circuit is configured to output one of the duty information signal and alignment data as the data based on the duty monitoring enable signal.

9. The semiconductor device of claim 8, wherein the selection transfer circuit comprises:

a latch control signal generation circuit configured to generate a latch control signal by buffering the mode register command during the time period when the duty monitoring enable signal is enabled;

a duty output signal generation circuit configured to generate a duty output signal that is reset when the duty monitoring enable signal is disabled by latching the duty information signal when the latch control signal is enabled; and a data output circuit configured to output the duty output signal as the data when the duty monitoring enable signal is enabled and configured to output the alignment data as the data when the duty monitoring enable signal is disabled.

10. The semiconductor device of claim 8, further comprising:

a memory circuit configured to output first internal data, second internal data, third internal data, and fourth internal data after a start of a read operation; and an alignment data generation circuit configured to generate the alignment data by aligning the first internal data, the second internal data, the third internal data, and the fourth internal data in synchronization with the first data clock signal and the second data clock signal.

11. The semiconductor device of claim 10, wherein the alignment data generation circuit comprises:

a division circuit configured to generate a first division clock signal, a second division clock signal, a third division clock signal, and a fourth division clock signal by dividing frequencies of the first data clock signal and the second data clock signal; and an alignment circuit configured to latch the first internal data, the second internal data, the third internal data, and the fourth internal data in synchronization with the first division clock signal, the second division clock signal, the third division clock signal, and the fourth division clock signal and configured to output, as the alignment data, the first to fourth internal data that are latched by serializing the latched first internal data, second internal data, third internal data, and fourth internal data.

12. A semiconductor device comprising:

a duty ratio determination circuit configured to generate a duty information signal in response to receiving a first data clock signal and a second data clock signal in phase or in reverse phase according to a phase selection signal and determining a duty ratio of the first data clock signal and the second data clock signal during a time period when a duty monitoring enable signal for performing a duty monitoring operation is enabled; and a data transfer circuit configured to latch the duty information signal when a mode register command is enabled, configured to generate first data or second data from the latched duty information signal based on a phase selection signal, and the data transfer circuit configured to output the first data or the second data to a controller.

13. The semiconductor device of claim 12, wherein the duty ratio determination circuit is configured to generate an input clock signal from the first data clock signal in response to receiving the first data clock signal and the second data clock signal in phase when the phase selection signal is enabled, to generate an inverted input clock signal from the second data clock signal, and to generate the duty information signal by determining a duty ratio of the input clock signal and the inverted input clock signal; and wherein the duty ratio determination circuit is configured to generate the inverted input clock signal from the first data clock signal in response to receiving the first data clock signal and the second data clock signal in reverse phase when the phase selection signal is disabled, to generate the input clock signal from the second data clock signal, and to generate the duty information signal by determining the duty ratio of the input clock signal and the inverted input clock signal.

14. The semiconductor device of claim 12, wherein the controller is configured to adjust the duty ratio of the first data clock signal and the second data clock signal based on the first data and the second data after a start of the duty monitoring operation.

15. The semiconductor device of claim 12, wherein the duty ratio determination circuit comprises:

a clock input circuit configured to generate an input clock signal from one of the first data clock signal and the second data clock signal based on the phase selection signal and configured to generate an inverted input clock signal from one of the first data clock signal and the second data clock signal;

a duty detection signal generation circuit configured to generate a duty detection signal by determining a duty ratio of the input clock signal and the inverted input clock signal when the mode register command is enabled during the time period when the duty monitoring enable signal is enabled; and a latch circuit configured to latch the duty detection signal when the mode register command is enabled during the time period when the duty monitoring enable signal is enabled and configured to output, as the duty information signal, the duty detection signal that is latched.

16. The semiconductor device of claim 15, wherein the clock input circuit comprises:

a first clock input circuit configured to output the first data clock signal as the input clock signal when the phase selection signal is enabled and configured to output the second data clock signal as the input clock signal when the phase selection signal is disabled; and a second clock input circuit configured to output the second data clock signal as the inverted input clock signal when the phase selection signal is enabled and configured to output the first data clock signal as the inverted input clock signal when the phase selection signal is disabled.

17. The semiconductor device of claim 15, wherein the duty detection signal generation circuit comprises:

a strobe signal generation circuit configured to generate a strobe signal by delaying the mode register command during the time period when the duty monitoring enable signal is enabled;

a comparison circuit configured to form a current path based on a driving control signal and configured to generate, in relation to the strobe signal, a first duty pulse and a second duty pulse by an amount of charge that is discharged through the current path according to the duty ratio of the input clock signal and the inverted input clock signal; and a duty detection signal driving circuit configured to reset the duty detection signal when the strobe signal is enabled and configured to generate the duty detection signal that is enabled from a time when the first duty pulse is enabled to a time when the second duty pulse is enabled.

18. The semiconductor device of claim 12, wherein the data transfer circuit comprises:

a first selection transfer circuit configured to latch the duty information signal when the mode register command is enabled and configured to generate the first data from the duty information signal that is latched when the phase selection signal is enabled; and a second selection transfer circuit configured to latch the duty information signal when the mode register command is enabled and configured to generate the second data from the duty information signal that is latched when the phase selection signal is disabled.

19. The semiconductor device of claim 18, wherein the first selection transfer circuit comprises:

a first latch control signal generation circuit configured to generate a first latch control signal by buffering the mode register command when the phase selection signal is enabled during the time period when the duty monitoring enable signal is enabled;

a first duty output signal generation circuit configured to generate a first duty output signal that is reset when the duty monitoring enable signal is disabled, by latching the duty information signal when the first latch control signal is enabled; and a first data output circuit configured to output the first duty output signal as the first data when the duty monitoring enable signal is enabled and configured to output the alignment data as the first data when the duty monitoring enable signal is disabled.

20. The semiconductor device of claim 18, wherein the second selection transfer circuit comprises:

a second latch control signal generation circuit configured to generate a second latch control signal by buffering the mode register command when the phase selection signal is disabled during the time period when the duty monitoring enable signal is enabled;

a second duty output signal generation circuit configured to generate a second duty output signal that is reset when the duty monitoring enable signal is disabled, by latching the duty information signal when the second latch control signal is enabled; and a second data output circuit configured to output the second duty output signal as the second data when the duty monitoring enable signal is enabled and configured to output the alignment data as the second data when the duty monitoring enable signal is disabled.

21. A duty monitoring method comprising:

a first duty ratio operation including entering a duty monitoring operation and outputting data generated from a duty information signal that is generated in response to receiving a first data clock signal and a second data clock signal in phase or in reverse phase according to a phase selection signal and determining a duty ratio of the first data clock signal and the second data clock signal when a mode register command is enabled; and a second duty ratio operation including outputting the data, the duty information signal that is generated in response to receiving the first data clock signal and the second data clock signal in phase or in reverse phase according to the phase selection signal and determining the duty ratio of the first data clock signal and the second data clock signal when the mode register command is enabled.

22. The duty monitoring method of claim 21, wherein:

in the first duty ratio operation and the second duty ratio operation, the duty ratio of the first data clock signal and the second data clock signal is determined in response to receiving the first data clock signal and the second data clock signal in phase when the phase selection signal is disabled, and in the first duty ratio operation and the second duty ratio operation, the duty ratio of the first data clock signal and the second data clock signal is determined in response to receiving the first data clock signal and the second data clock signal in reverse phase when the phase selection signal is enabled.

23. The duty monitoring method of claim 21, wherein the first duty ratio operation comprises:

generating the mode register command and a duty monitoring enable signal based on a command address;

generating the phase selection signal based on the command address and generating an input clock signal and an inverted input clock signal in response to receiving the first data clock signal and the second data clock signal in phase or in reverse phase based on the phase selection signal; and generating the duty information signal by determining a duty ratio of the input clock signal and the inverted input clock signal and outputting the data generated from the duty information signal.

24. The duty monitoring method of claim 21, wherein the second duty ratio operation comprises:

generating the mode register command and a duty monitoring enable signal based on a command address;

generating the phase selection signal based on the command address and generating an input clock signal and an inverted input clock signal in response to receiving the first data clock signal and the second data clock signal in phase or in reverse phase based on the phase selection signal; and generating the duty information signal by determining a duty ratio of the input clock signal and the inverted input clock signal and outputting the data generated from the duty information signal.

25. The duty monitoring method of claim 21, wherein in the first duty ratio operation and the second duty ratio operation, the duty ratio of the first data clock signal and the second data clock signal is adjusted based on the data.

26. The duty monitoring method of claim 21, wherein, when an operation of adjusting the duty ratio of the first data clock signal and the second data clock signal is completed during the second duty ratio operation, the duty monitoring operation is terminated; and wherein the duty monitoring method further comprises entering the first duty ratio operation again when an operation of adjusting the duty ratio of the first data clock signal and the second data clock signal is not completed during the second duty ratio operation.

27. A method comprising:

during a first time period, receiving a first data clock signal and a second data clock signal either in phase or in reverse phase;

during the first time period, determining a duty ratio of the first data clock signal and the second data clock signal when a mode register command is enabled;

generating a duty information signal in response to determining the duty ratio of the first data clock signal and the second data clock signal; and outputting data generated from the duty information signal when the mode register command is enabled.

* * * * *